(12) United States Patent
Venkataramanan et al.

(10) Patent No.: US 11,774,621 B2
(45) Date of Patent: Oct. 3, 2023

(54) METHODS FOR DETERMINING FLUID VOLUMES FROM NMR T1-T2 LOG DATA

(71) Applicant: SCHLUMBERGER TECHNOLOGY CORPORATION, Sugar Land, TX (US)

(72) Inventors: Lalitha Venkataramanan, Lexington, MA (US); Noyan Evirgen, Ankara (TR); David Allen, Katy, TX (US); Albina Mutina, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 332 days.

(21) Appl. No.: 16/757,607

(22) PCT Filed: Oct. 22, 2018

(86) PCT No.: PCT/US2018/056820
§ 371 (c)(1),
(2) Date: Apr. 20, 2020

(87) PCT Pub. No.: WO2019/079784
PCT Pub. Date: Apr. 25, 2019

(65) Prior Publication Data
US 2020/0264331 A1 Aug. 20, 2020

Related U.S. Application Data

(60) Provisional application No. 62/574,992, filed on Oct. 20, 2017.

(51) Int. Cl.
*G01V 3/32* (2006.01)
*E21B 49/08* (2006.01)
(Continued)

(52) U.S. Cl.
CPC .............. *G01V 3/32* (2013.01); *E21B 49/087* (2013.01); *G01F 22/00* (2013.01); *G01V 3/38* (2013.01)

(58) Field of Classification Search
CPC ... G01V 3/32; G01V 3/38; G01V 5/04; E21B 49/087; G01F 22/00
(Continued)

(56) References Cited

U.S. PATENT DOCUMENTS 8,427,145 B2 * 4/2013 Mitchell .................. G01V 3/32
324/309
10,228,484 B2 * 3/2019 Wang ...................... E21B 49/00
(Continued)

FOREIGN PATENT DOCUMENTS

CA        2416511 C  *  5/2012  .......... G01N 24/081
WO     2017023459 A1     2/2017
(Continued)

OTHER PUBLICATIONS

Venkataramanan et al., "Solving Fredholm Integrals of the First Kind With Tensor Product Structure in 2 and 2.5 Dimensions", IEEE Transactions on Signal Processing, vol. 50, No. 5, May 2002, pp. 1017-1026.
(Continued)

*Primary Examiner* — Jermele M Hollington
*Assistant Examiner* — Sean Curtis

(57) ABSTRACT

Methods and systems are provided for characterizing fluids in a subterranean formation traversed by a borehole, where NMR data is measured by a downhole NMR tool that is conveyed in the borehole that traverses the formation. The NMR data is processed to derive T1-T2 maps at different depths of the formation. The T1-T2 maps at different depths of the formation can be processed to generate a cluster map of different fluids that are present in the formation, wherein
(Continued)

the cluster map is a two-dimensional array of grid points in the T1-T2 domain with each grid point being assigned or classified to a specific fluid. The cluster map of different fluids that are present in the formation can be used to characterize properties of the formation, such as fluid volumes for the different fluids at one or a number of depths.

20 Claims, 24 Drawing Sheets

(51) Int. Cl.
*G01F 22/00* (2006.01)
*G01V 3/38* (2006.01)

(58) Field of Classification Search
USPC .......................................................... 324/303
See application file for complete search history.

(56) References Cited

U.S. PATENT DOCUMENTS

| | | | | |
|---|---|---|---|---|
| 10,393,912 | B2* | 8/2019 | Chok | G01V 3/34 |
| 10,401,313 | B2* | 9/2019 | Anand | G01V 3/32 |
| 10,585,083 | B2* | 3/2020 | Anand | E21B 47/00 |
| 10,718,701 | B2* | 7/2020 | Cao Minh | G01V 3/32 |
| 2002/0167314 | A1 | 11/2002 | Prammer | |
| 2014/0292325 | A1* | 10/2014 | Heule | G01R 33/448 |
| | | | | 324/309 |
| 2016/0047936 | A1* | 2/2016 | Ali | G01N 24/081 |
| | | | | 324/303 |
| 2016/0334346 | A1* | 11/2016 | Cao Minh | G01R 33/448 |
| 2017/0003411 | A1* | 1/2017 | Chok | G01R 33/448 |
| 2017/0123098 | A1* | 5/2017 | Wang | G01V 3/38 |
| 2017/0343497 | A1* | 11/2017 | Anand | G01R 33/448 |
| 2017/0356896 | A1* | 12/2017 | Anand | G01R 33/448 |
| 2019/0383757 | A1* | 12/2019 | Anand | G01R 33/448 |
| 2020/0174153 | A1* | 6/2020 | Song | G01N 24/081 |
| 2020/0264331 | A1* | 8/2020 | Venkataramanan | E21B 49/087 |

FOREIGN PATENT DOCUMENTS

| | | | | |
|---|---|---|---|---|
| WO | WO-2018217847 | A1* | 11/2018 | G01N 24/081 |
| WO | WO-2019079784 | A1* | 4/2019 | E21B 49/087 |

OTHER PUBLICATIONS

Anand et al., "Unlocking the potential of unconventional reservoirs though new generation NMR T1/T2 logging measurements integrated with advanced wireline logs", SPWLA 57th Annual Logging Symposium, 2016, 15 pages.

Anand et al., "Toward accurate reservoir characterization from new generation NMR logging" SPWLA 58th Annual Logging Symposium, 2017, 15 pages.

Search Report and Written Opinion of International Patent Application No. PCT/US2018/056820 dated Jan. 25, 2019; 13 pages.

Ortiz et al., "Characteristics of Vaca Muerta formation revealed by NMR T1-T2 logging at large scale", SPWLA 58th Annual Logging Symposium, 2017, 13 pages.

Kausik et al., "NMR Relaxometry in Shale and Implications for Logging", Petrophysics, vol. 57, No. 4, Aug. 2016, pp. 339-350.

Freedman et al., "Wettability, Saturation, and Viscosity From NMR Measurements", SPE journal, Dec. 2003, pp. 317-327.

Wang, "Sparse Clustered Bayesian-lnspired T1-T2 Inversion from Borehole NMR Measurements", IEEE Transactions on Computational Imaging, Jun. 2017, vol. 3, No. 2, pp. 1-14.

International Preliminary report on Patentability of International Patent Application No. PCT/US2018/056820 dated Apr. 30, 2020; 11 pages.

Kausik et al., "NRM Petrophysics for Tight Oil Shale Enabled by Core Resaturation", the International Symposium of the Socielty of Core Analysis, Sep. 8-11, 2014, vol. 3, pp. 1-6.

* cited by examiner

| Fluid species | $T_1/T_2$ ratio |
|---|---|
| gas | 1 |
| water | 1 |
| Oil | 1 |
| Water in IP | 1-2 |
| Oil in IP | 1-2 |
| Clay bound water | 1-2 |
| Movable oil in OP | 3-6 |
| Immovable oil in OP | 3-6 |
| Gas in IP | 1-2 |
| Gas in OP | 1-2 |
| Bitumen | 4-15 |
| Kerogen | Not visible at Low field |

FIG. 7B

METHODS FOR DETERMINING FLUID VOLUMES FROM NMR T1-T2 LOG DATA

CROSS-REFERENCE TO RELATED APPLICATIONS

This application claims the benefit of priority under 35 U.S.C. 119(e) to U.S. Provisional Patent Application No. 62/574,992, filed Oct. 20, 2017, the entire contents of which are incorporated herein by reference.

FIELD

The present disclosure relates to NMR T1-T2 log data and unsupervised machine learning, and more particularly to determining fluid volumes and other formation properties from NMR T1-T2 log data.

BACKGROUND

NMR provides the ability to quantify volumes of different fluids that can be present in-situ in a subterranean reservoir. The different fluids have unique signatures in the T1-T2 domain. FIGS. 1A, 1B, 1C and 1D shows T1-T2 maps corresponding to four fluids (bitumen and clay bound water; water in a limestone rock and an oil with a viscosity of 100 cp) obtained in the laboratory under high signal-to-noise ratios (SNRs). Although each fluid has a unique T1-T2 signature, this signature is unknown. For example, different kinds of clay can have different signatures. The definition of bitumen is operational, consequently it can vary from one formation to another. Similarly, the T1-T2 signature of oil and water are dependent on the configuration of oil and water in the rock along with its pore geometry and oil properties.

In a single-well log, depth varying T1-T2 maps reflect a variation in rock and fluid properties. When the formation is homogenous, it is possible to delineate the effects of rock and fluids and compute a depth-log of the various fluid volumes. Decisions on where to land a lateral well and properties such as reservoir quality index are often based on the volume fractions of these fluids derived from NMR T1-T2 maps. For example, a high volume of bitumen coupled with a low volume of hydrocarbon reflects a poor reservoir quality rock. On the other hand, a low volume of bitumen occurring with a high volume of producible hydrocarbon reflects a good quality rock.

A key objective for formation evaluation (particularly in unconventional reservoirs) is to estimate reservoir quality by quantifying the volumes of different fluids in a formation from T1-T2 maps derived from nuclear magnetic resonance (NMR) measurements at different depths of the formation. The different fluids (e.g., bitumen, producible and bound oil and water, gas) and pore geometries have their own unique signatures in the T1-T2 domain. When the formation is homogenous, it is possible to delineate the signature due to variation in pore geometry from variation in fluid volumes. Fluid volumes are typically calculated by use of pre-determined cut-off values obtained from analysis of laboratory data in the T1-T2 domain. However, these cut-off values can vary between formations and are dependent on the underlying unknown fluid properties.

There are some fundamental challenges in computing the fluid volumes from downhole T1-T2 maps. Fluid volumes are typically calculated by use of pre-determined cut-off values obtained from analysis of laboratory data in the T1-T2 domain. Importantly, there are no universal cut-off values that can be applied to all fluids across different formations. Moreover, the number of fluids in formation and their corresponding signatures in the T1-T2 domain are unknown. Finally, the T1-T2 map does not often have a high resolution since it is not measured but obtained from an ill-conditioned inversion of low-dimensional time-domain magnetization data obtained typically at low SNRs downhole.

In the literature, the problem of computing volumes has often been formulated in an optimization framework, minimizing a cost function of the form, $$\underset{W \geq 0, H \geq 0}{\arg\min} \|V - WH\|^2. \quad (1)$$

See (i) V. Anand, M. Rampurawala Ali, A. Abubakar, R. Grover, O. Neto, I. Pirie and J. Iglesias, "Unlocking the potential of unconventional reservoirs through new generation NMR T1/T2 logging measurements integrated with advanced wireline logs", SPWLA 57$^{th}$ Annual Logging symposium, 2016; ii) V. Anand, B. Sun, L. Mosse, A. Mutina, T. Jiang, R. L. Brown and L. Crousse, "Toward accurate reservoir characterization from new generation NMR logging", SPWLA 58$^{th}$ Annual Logging symposium, 2017; and iii) A. Ortiz, L. Mosse, C. Bernhardt, V. Anand, R. Kausik and E. Rylander, "Characteristics of Vaca Muerta formation revealed by NMR T1-T2 logging at large scale, SPWLA 58$^{th}$ Annual Logging symposium, 2017. Here the matrix $V \in N_{T1}N_{T2} \times N_D$ contains T1-T2 maps (each of size $N_{T1}N_{T2}$) over depths $N_D$. The goal is to estimate matrices $W \in N_{T1}N_{T2} \times N_c$ and $H \in N_c \times N_D$, where H is the volumes of the formation fluids. Each column in matrix W corresponds to the T1-T2 signature of the underlying fluid and is normalized to unity. Since both matrices W and H are unknown, this approach is often referred to as blind source separation (BSS). The parameter $N_c$ represents the number of fluids and is unknown. Typical values of $N_{T1}N_{T2} \approx 10^4$, $N_D \approx 200$ and $N_c \approx 1-8$. Thus, this work has focused on constructing a low-rank approximation of V and factorize it into matrices W and H, whose elements are non-negative. However, since the cost function in Eqn. (1) is non-convex, there are multiple solutions for matrices W and H which correspond to the local minima of the cost function. The accuracy of the solution is strongly dependent on the availability of a wide dynamic range of the volumes of underlying fluids.

SUMMARY

The present disclosure provides methods and systems that can automatically determine the volumes of different fluids that are present in a formation (and possibly other formation properties) from T1-T2 maps derived from NMR data measured at multiple depths of the formation. For example, the different fluids can include bitumen, clay bound water, producible water in rock, oil, and/or other hydrocarbons. The NMR data can be measured and acquired by an NMR tool that is conveyed in a borehole that traverses the formation. The methods and systems determine a cluster map of the specific fluids in the T1-T2 maps. The cluster map is a two-dimensional array of grid points in the T1-T2 domain where each grid point is assigned or classified to a specific fluid. The cluster map can be applied to a T1-T2 map corresponding to a depth in the formation to compute fluid volumes for the different fluids at the corresponding depth. Such analysis can be repeated for multiple depths in the formation to compute fluid volumes for the different fluids at the multiple depths. The cluster map can also be applied to T1-T2, T1, T2 distributions corresponding to a depth in the formation to extract the T1-T2, T1, T2 distributions for the different fluids at the corresponding depth. Such analysis can be repeated for multiple depths in the formation to extract the T1-T2, T1, T2 distributions for the different fluids at the multiple depths. The extracted T1-T2, T2 and T1 distributions of the different fluids as a function of depth can be used for additional analysis and interpretation, for example to estimate oil viscosity, rock quality, permeability, and others petrophysical properties and their variation with depth.

In embodiments, the cluster map can be derived from an automatic method using an unsupervised learning approach as follows. First, the signal to noise (SNR) in the T1-T2 maps is used to obtain an estimate of an overall footprint for all the fluids present in the formation. Second, assuming that a given number of fluids is present in the formation and known and assuming each point in T1-T2 space corresponds at most to one fluid, a non-negative matrix factorization (NNMF) technique can be used to compute an initial cluster map corresponding to the given number of fluids. Next, an automatic hierarchical clustering process can be used to determine a cluster map where the cluster for a number of fluids is compact and connected in the T1-T2 domain. Sub-sampling of the measured T1-T2 maps can be used to study the stability and determine the cluster map that includes the most likely number of fluids present in the T1-T2 maps. Specific fluids can be assigned or otherwise associated with the clusters of the cluster map based on domain knowledge or automatic processes for reservoir understanding and analysis.

BRIEF DESCRIPTION OF THE DRAWINGS

FIG. 7B is a chart of T1/T2 ratios or ranges thereof that are known to indicate the presence of certain formation fluid types as shown;

FIG. 8A shows a graphical representation of a cluster map of the six fluids used to simulate the data. 100 different data sets with varying amounts of fluids were used to simulate magnetization data. The data was inverted to obtain T1-T2 maps, which were subsequently analyzed by the methodology of the present disclosure. FIG. 8B shows histogram obtained by sub-sampling. FIG. 8C shows the cluster map for $N_C$=6. FIG. 8D shows the volume fractions of the six clusters obtained from FIG. 8B in comparison with the true volume fractions of the fluids used in the simulation. FIG. 8E shows the estimated volume fractions from the prior art blind source separation technique in comparison with the true volume fractions;

DETAILED DESCRIPTION

The particulars shown herein are by way of example and for purposes of illustrative discussion of the examples of the subject disclosure only and are presented in the cause of providing what is believed to be the most useful and readily understood description of the principles and conceptual aspects of the subject disclosure. In this regard, no attempt is made to show details in more detail than is necessary, the description taken with the drawings making apparent to those skilled in the art how the several forms of the subject disclosure may be embodied in practice. Furthermore, like reference numbers and designations in the various drawings indicate like elements.

The methodology and systems of the present disclosure estimates a cluster map of the different fluids in the T1-T2 domain from T1-T2 maps derived from NMR data measured at multiple depths of a formation. The NMR data can be measured by an NMR tool that is conveyed in a borehole that traverses the formation, for example as described below with respect to FIG. 9. The NMR data and corresponding T1-T2 maps can characterize a particular interval of interest within the formation. In embodiments, the particular interval of interest of the formation can be identified based on measurements and analysis of various rock and fluid properties of the formation that infer that the particular interval of interest of the formation possibly contains hydrocarbons (or contains hydrocarbons within some other probabilistic criterion) and possibly information related to producibility of these hydrocarbons. The various rock and fluid properties of the formation can involve downhole NMR measurements carried out by the NMR tool that is conveyed in the borehole that traverses the formation (for example, as described below with respect to FIG. 9), other downhole measurements carried out by other downhole tool(s) conveyed in the borehole that traverses the formation (for example, as described below with respect to FIG. 9), downhole measurements from other boreholes that traverse the formation or some like formation, other surveys, and possibly laboratory measurements of reservoir fluids and core samples as well.

Figure 1A:
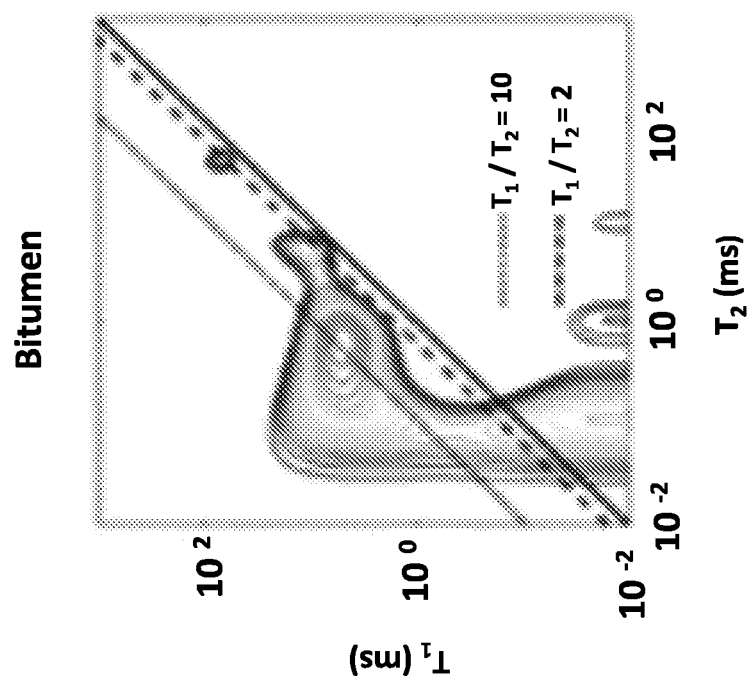
FIGS. 1A, 1B, 1C and 1D are T1-T2 plots for four different fluids (bitumen, water in rock, clay bound water, and oil) that show that different fluids have different signatures in the T1-T2 domain.
Figure 1B:
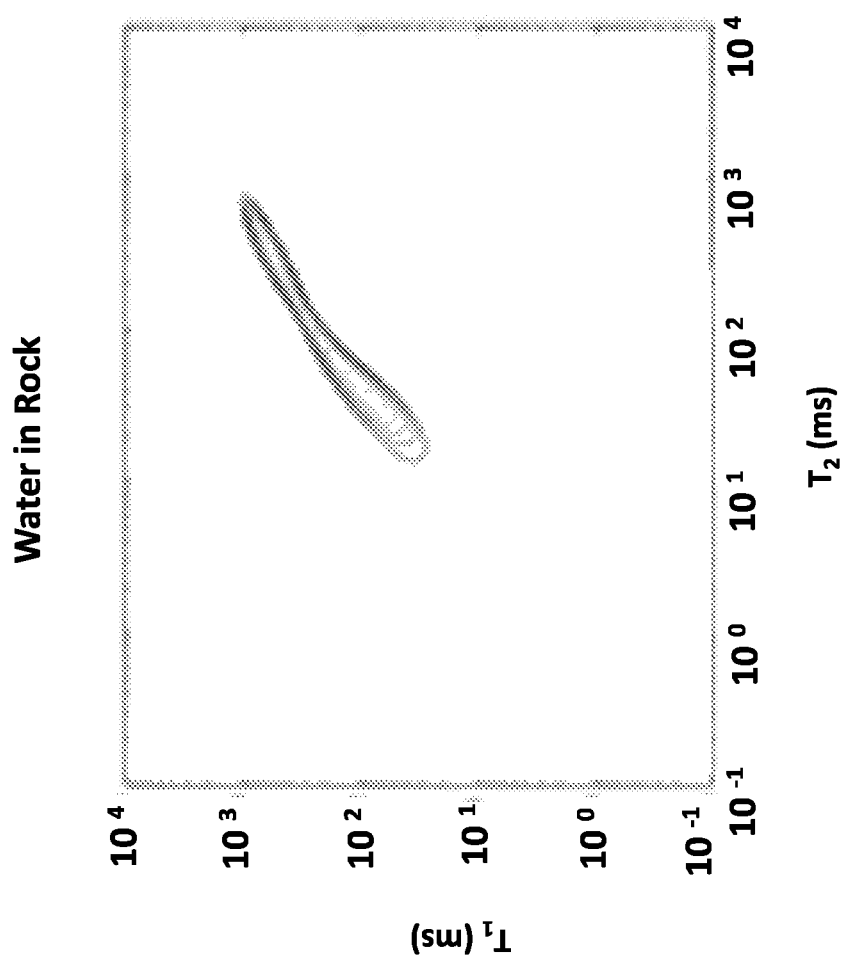
Figure 1C:
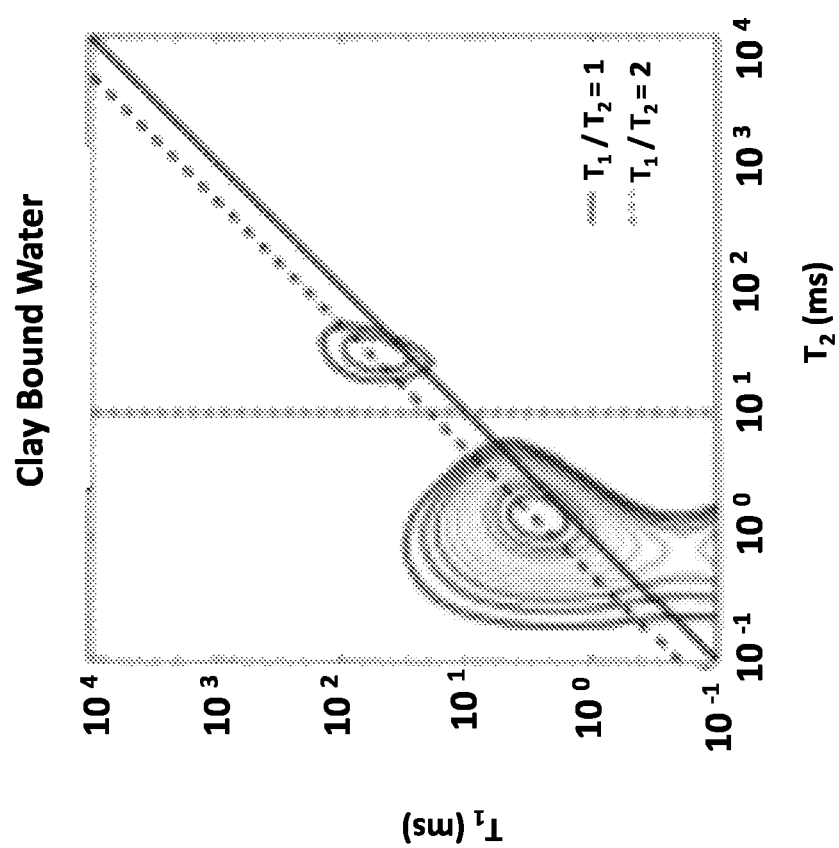
Figure 1D:
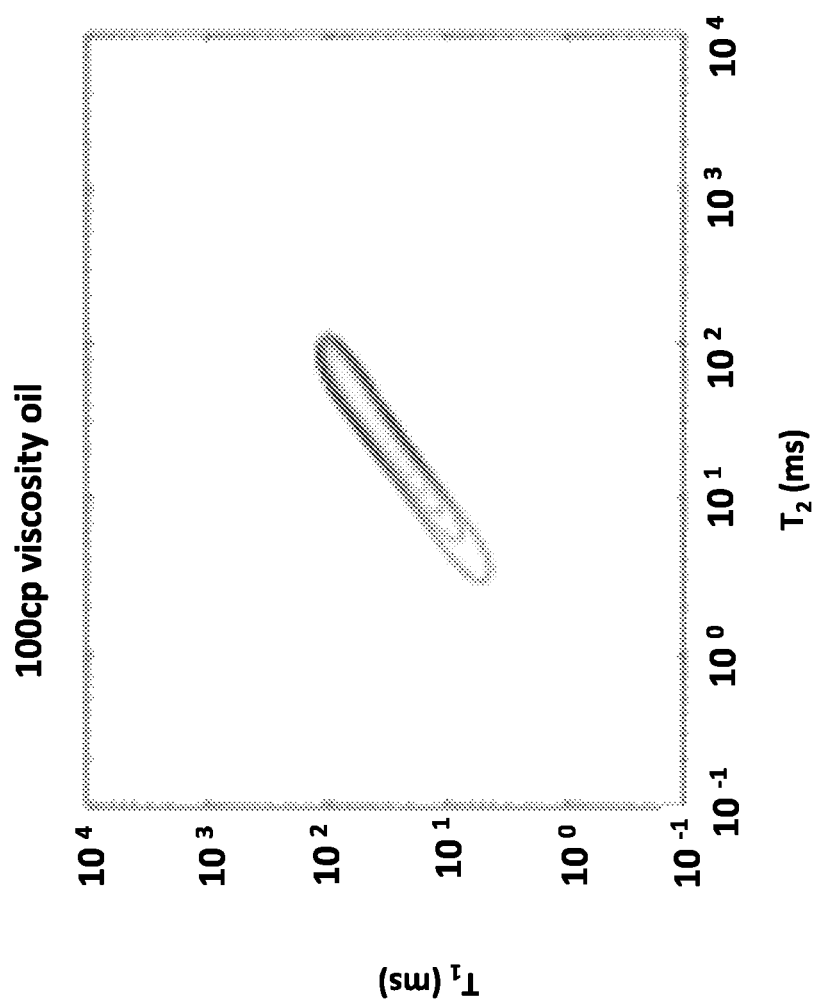
Figure 2A:
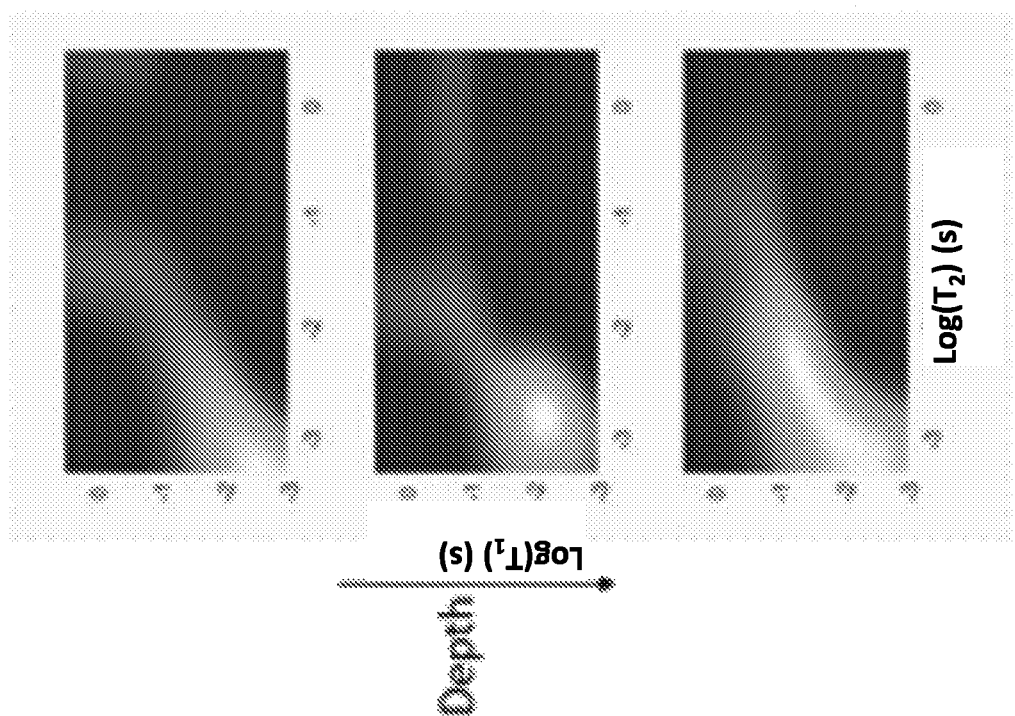
FIG. 2A is a graphical representation of three T1-T2 maps corresponding to different depths over a homogenous interval in a well that traverses the Eagle Ford formation of Texas; the difference in the T1-T2 maps is due to variation in fluid volumes.
Figure 2B:
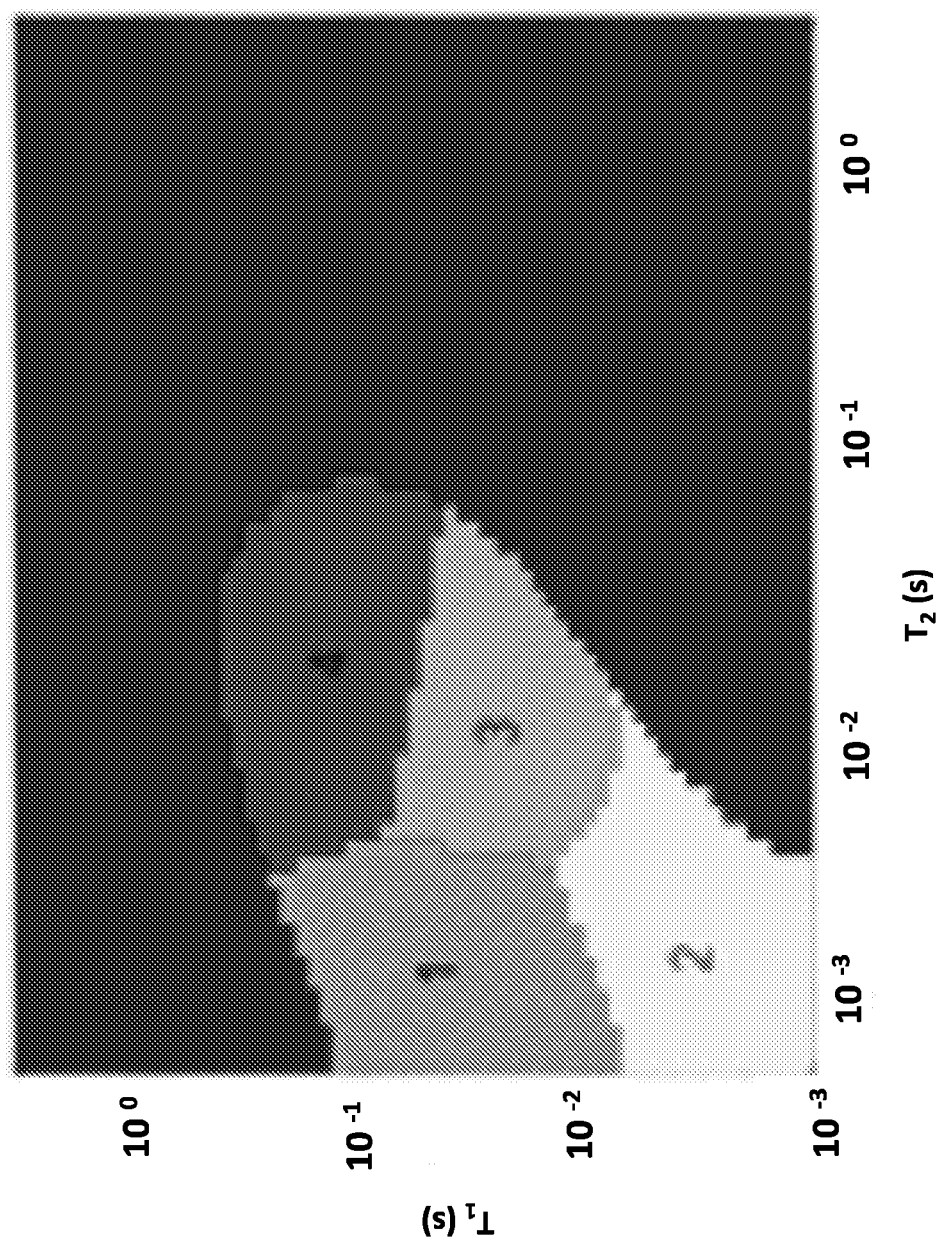
FIG. 2B is a graphical representation of a cluster map resulting from the automated classification methodology described herein; the cluster map has 4 clusters (labeled 1, 2, 3 and 4) each corresponding to different fluids that are present in the formation.

The cluster map is a two-dimensional array of grid points in the T1-T2 domain where each grid point is assigned or classified to a specific fluid that is present in the formation. In embodiments, each grid point of the cluster map corresponds to different pairs of T1-T2 values in the T1-T2 domain and can be assigned or classified to a specific fluid that is present in the formation by the automatic method. Mathematically, this corresponds to finding a compact, connected and non-overlapping support for each column in a matrix $\tilde{W}$, which is in a reduced T1-T2 domain. For example, FIG. 2A shows the T1-T2 maps corresponding to multiple depths in the Eagle Ford formation. FIG. 2B shows the results of application of the automated methodology of the present disclosure to obtain the cluster map. In this example, the cluster map includes four clusters, each classified to a different fluid that is present in the formation. Once the cluster map is computed, boundaries separating the different fluid classes in the T1-T2 domain can be drawn and the fluid volumes at any depth of the formation can be computed from these boundaries and the T1-T2 map for that depth. Furthermore, the cluster map (and resulting boundaries in the T1-T2 domain) can be applied to T1-T2, T1 and/or T2 distributions corresponding to a depth in the formation to extract the T1-T2, T1 and/or T2 distributions for the different fluids at the corresponding depth. Such analysis can be repeated for multiple depths in the formation to extract the T1-T2, T1 and/or T2 distributions for the different fluids at the multiple depths. The extracted T1-T2, T1 and/or T2 distributions of the different fluids as a function of depth can be used for additional analysis and interpretation, for example to estimate oil viscosity, rock quality, permeability, and other petrophysical properties and their variation with depth.

Figure 3:
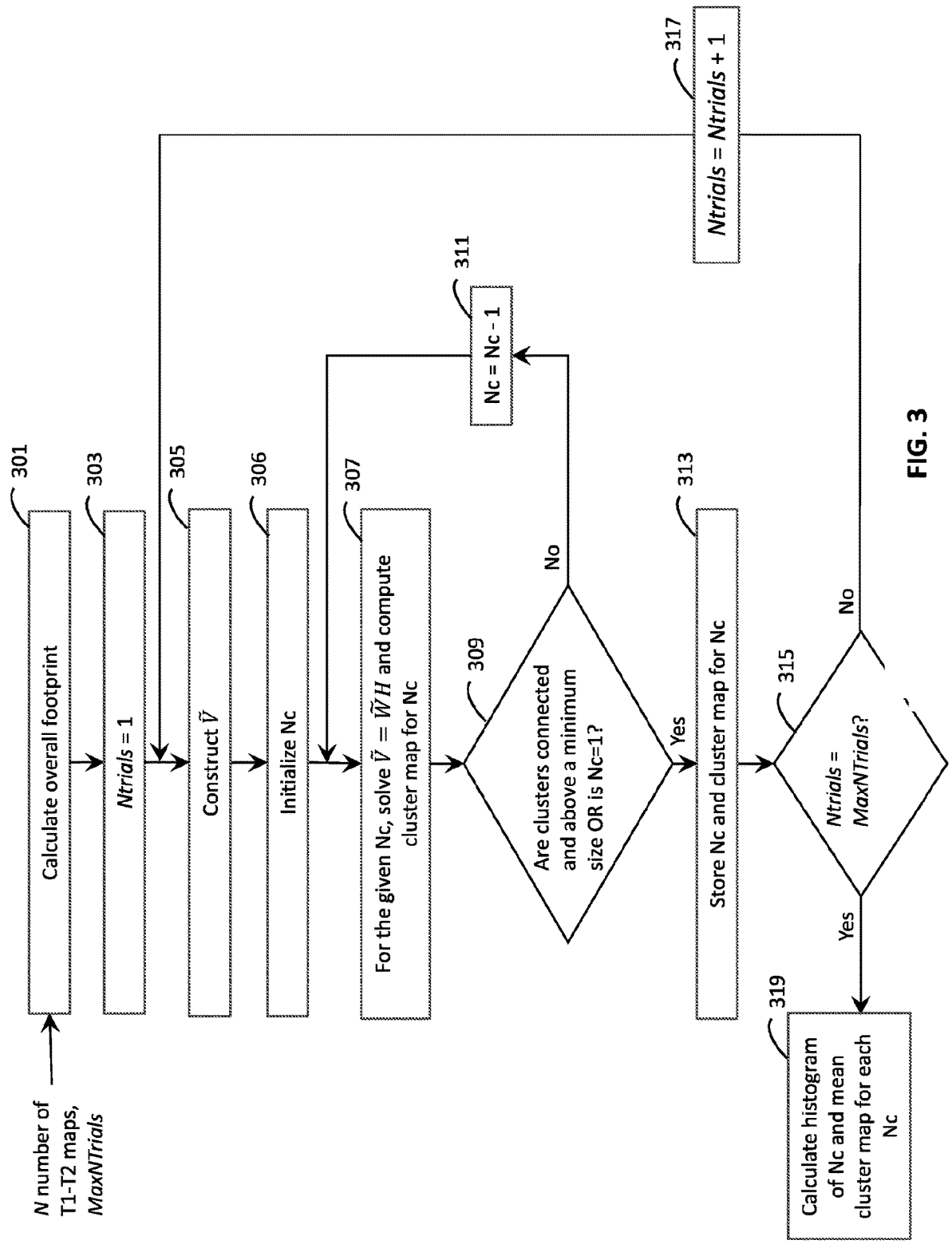
FIG. 3 is a flow chart of an embodiment of an unsupervised learning algorithm that uses T1-T2 maps derived from measured NMR data at multiple depths of a formation to determine a cluster map of a number of different fluids that are present in the formation.

In this section, we describe an unsupervised learning algorithm that uses T1-T2 maps derived from measured NMR data at multiple depths within an interval of interest of the formation to determine a cluster map of a number of different fluids that are present in the formation. The method includes the following steps and is shown in the flowchart of FIG. 3.

First, in the block 301, the SNR of T1-T2 maps at multiple depths are input to the process and used to define a sub-space in the T1-T2 domain over which all of the fluids in the formation is significant in the T1-T2 domain. The representation of this sub-space in the T1-T2 domain is referred to as an overall footprint. This can involve averaging the T1-T2 maps over multiple depths within an interval of interest of the formation and applying a threshold function to the average T1-T2 map to identify a sub-space of the T1-T2 domain that reflects the presence of one or more fluids in the formation. Thus each grid point in T1-T2 space can be represented by a variable or flag that has one of two values (for example, zero, one) based on the result of the threshold function for the corresponding grid point in the average T1-T2 map, where one value (e.g., zero) represents that the corresponding grid point in the T1-T2 domain does not reflect the presence of one or more fluids in the formation and the other value (e.g., one) represents that the corresponding grid point in the T1-T2 domain does reflect the presence of one or more fluids in the formation.

Figure 4A:
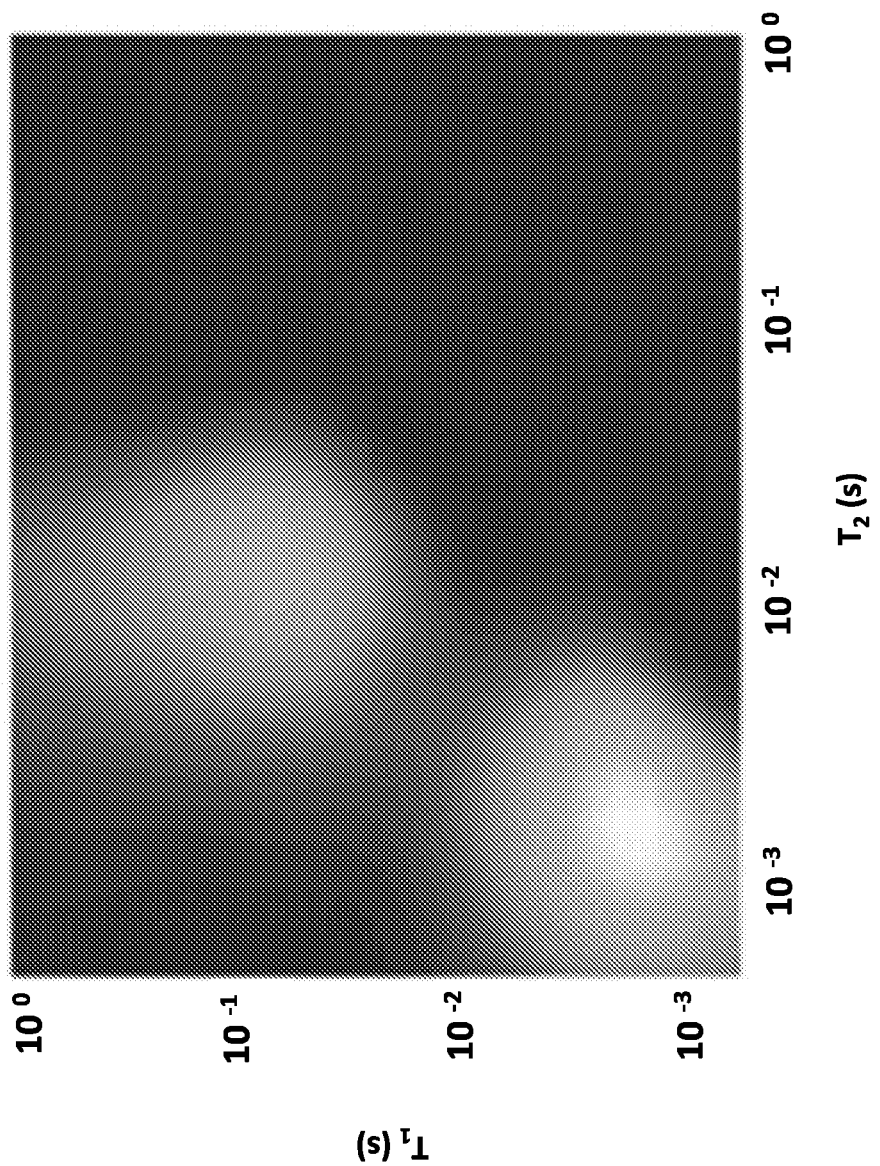
FIG. 4A is a graphical representation of the SNR of the measured NMR data (or of the T1-T2 maps) at multiple depths, which can be used to define an overall footprint as shown in FIG. 4B. Note that subsequent matrix operations can be performed within the reduced space of the T1-T2 domain of the overall footprint in order to reduce the computational complexity and memory for subsequent mathematical operations.
Figure 4B:
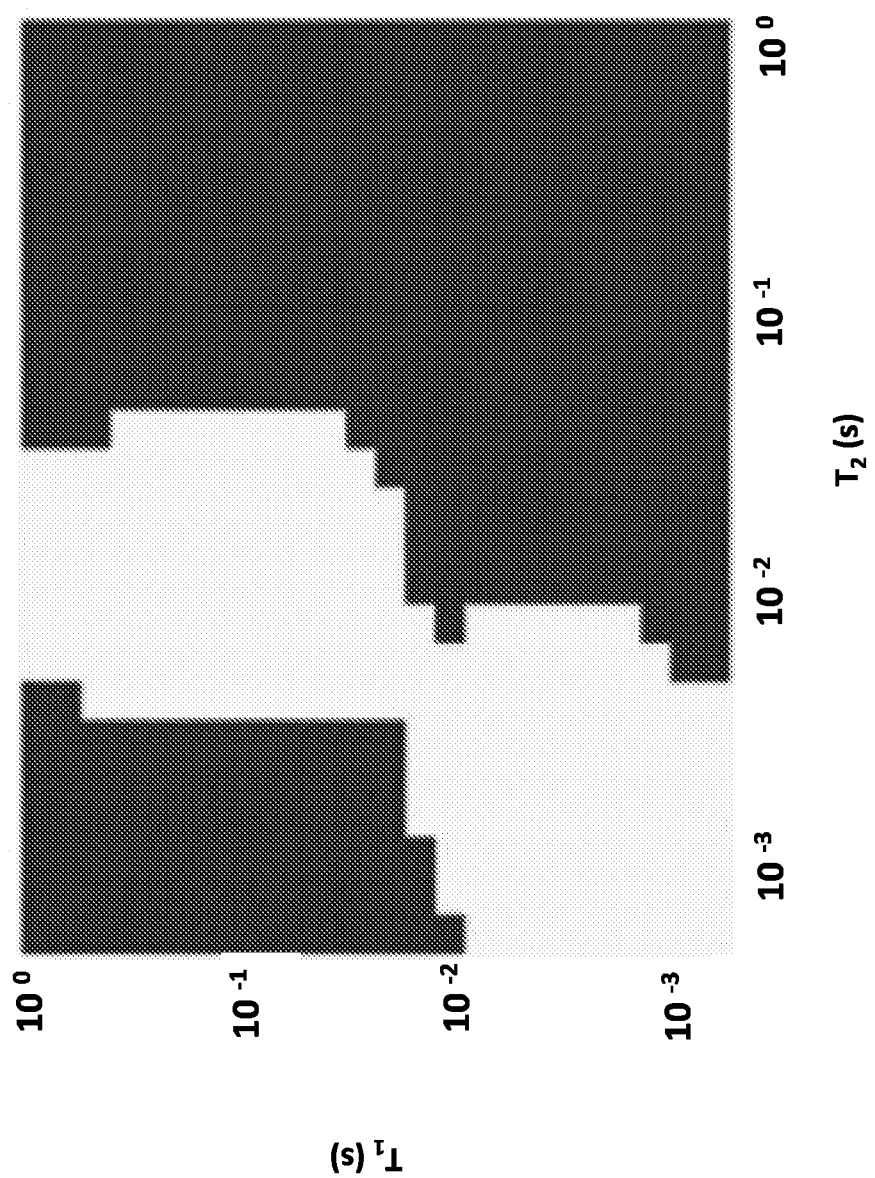
FIG. 4C is the graphical representation of the matrix W when the number of fluid components $N_C$ is 2. This matrix can be used to derive the cluster map of FIG. 4E.
FIG. 4D is a schematic illustration of exemplary operations that construct a cluster map from the fluid signatures of a $\tilde{W}$ matrix. Such operations can be used to construct the cluster map of FIG. 4E from the matrix $\tilde{W}$ of FIG. 4C when the number of fluid components $N_C$ is 2.
FIG. 4E is a cluster map derived from the estimated T1-T2 fluid signatures of the two fluids shown in FIG. 4C under the assumption that for each point in the T1-T2 space the estimated T1-T2 fluid signatures can at most correspond to one fluid.

The operations of block 301 are illustrated in FIGS. 4A and 4B where the T1-T2 maps at multiple depths are averaged to generate the average T1-T2 map shown in FIG. 4A, and a thresholding function is applied to the average T1-T2 map of FIG. 4A to produce the overall footprint shown in FIG. 4B. In FIG. 4B, the grid points of the T1-T2 domain that have the first value (e.g., zero) and thus do not reflect the presence of one or more fluids in the formation are marked as black while the grid points of the T1-T2 domain that have the second value (e.g., one) and thus do reflect the presence of one or more fluids in the formation are marked as white.

Note that the area of the overall footprint in the T1-T2 domain can be much smaller than the entire T1-T2 domain of interest, which significantly reduces computational complexity of the subsequent steps.

In block 303, a counter variable Ntrials is initialized to a value of 1.

In block 305, a matrix $\tilde{V}$ is constructed from the information of the T1-T2 maps corresponding to different depths as input to the process and at grid points that fall within the reduced T1-T2 space of the overall footprint. Each row in matrix $\tilde{V}$ corresponds to a grid point in the reduced T1-T2 space. Each column in $\tilde{V}$ corresponds to a specific depth.

In block 306, an initial guess for $N_c$ is determined. In embodiments, the initial guess for $N_c$ can be obtained from the smallest cluster map that is obtainable from the data at a given SNR.

In block 307, a non-negative matrix factorization (NNMF) is performed on the matrix $\tilde{V}$ of block 305 to determine estimated T1-T2 fluid signatures for $N_c$ different components dictated by the initial guess of $N_c$ of block 306. In this case, the matrix $\tilde{V}$ is a product of matrices $\tilde{W}$ and H such that $\tilde{V}=\tilde{W}H$. The matrix $\tilde{W}$ represents estimated T1-T2 fluid signatures. Specifically, the rows of the matrix $\tilde{W}$ corresponds to the grid points of the matrix $\tilde{V}$ within the reduced T1-T2 domain of the overall footprint and the columns of the matrix $\tilde{W}$ correspond to the $N_c$ different fluids. The data element at a given row and column of the matrix $\tilde{W}$ represents the likelihood that the corresponding grid point in the reduced T1-T2 domain (indexed by the row of the matrix $\tilde{W}$) should be assigned to the corresponding fluid type (indexed by the column of the matrix $\tilde{W}$). Matrix multiplication can be implemented as computing the column vectors of $\tilde{V}$ as linear combinations of the column vectors in $\tilde{W}$ using data supplied by columns of H. Each row in H corresponds to the porosity of a particular fluid type, and each column in H corresponds to the porosities of the different fluid types at a specific depth. In embodiments, the non-negative matrix factorization (NNMF) can solve for the matrix $\tilde{W}$ by minimizing $$\underset{\tilde{W} \geq 0, H \geq 0}{\arg\min} (\tilde{V} - \tilde{W}H)^T \Sigma^{-1} (\tilde{V} - \tilde{W}H). \quad (2)$$

Here, the matrix $\Sigma$ is used to capture the uncertainty in the T1-T2 maps in the reduced space of the overall footprint and can be obtained by inversion algorithms. An example of such inversion algorithms is discussed in Venkataramanan et al., "Solving Fredholm Integrals of the First Kind with Tensor Product Structure in 2 and 2.5 Dimensions," IEEE Transactions on Signal Processing, Vol. 50, No. 5, May 2002. Given matrices, $\Sigma$ and $\tilde{V}$, eqn. (2) can be solved using well known non-negative matrix factorization techniques. For example, some non-negative matrix factorization techniques are based on alternating non-negative least squares: in each step of such an algorithm, first H is fixed and $\tilde{W}$ found by a non-negative least-squares solver, then $\tilde{W}$ is fixed and H is found analogously. The procedures used to solve for $\tilde{W}$ and H may be the same or different. Some non-negative matrix factorization techniques regularize only one of $\tilde{W}$ and H. Specific non-negative matrix factorization techniques include projected gradient descent methods, active set method, optimal gradient method, and the block principal pivoting method. Other non-negative matrix factorization techniques can also be used.

Figure 4C:
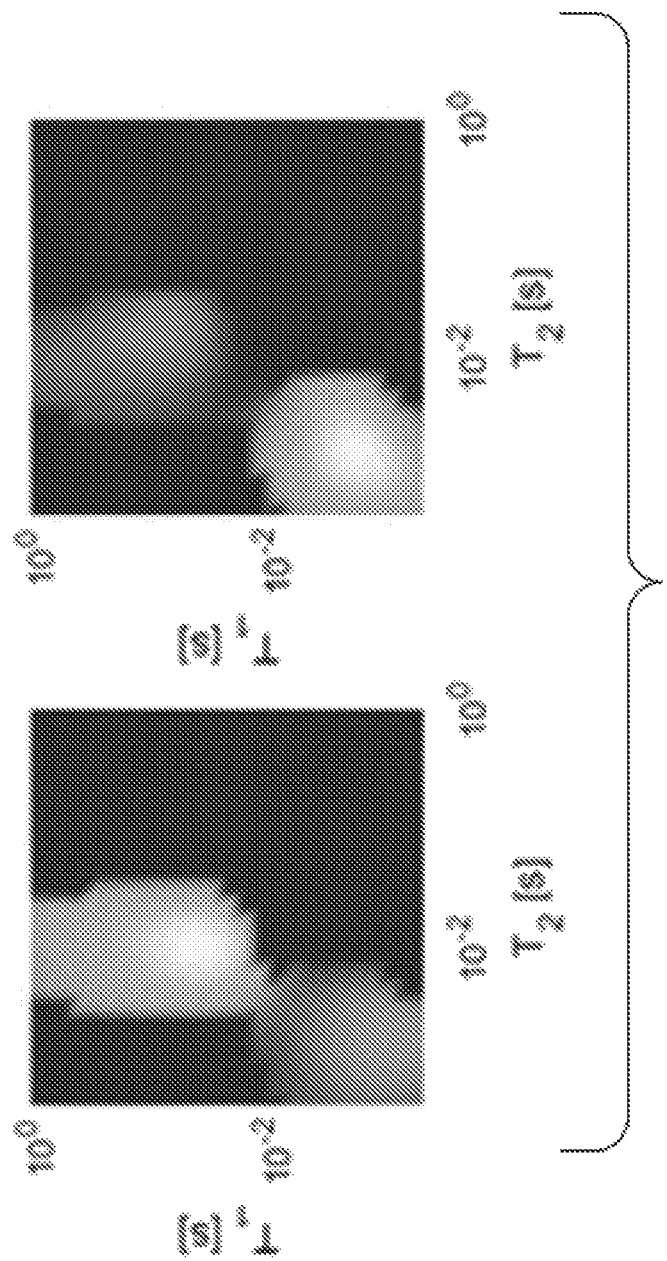

FIG. 4C shows the estimated T1-T2 fluid signatures, which correspond to two different columns of the $\tilde{W}$ matrix and obtained as a result of the NNMF of block 307 for $N_c=2$.

Furthermore, as part of block 307, a cluster map is constructed under the assumption that any point in the T1-T2 domain of the fluid signatures of the $\tilde{W}$ matrix can at most belong to a single fluid. In cases where multiple iterations of block 307 are carried out for automatic hierarchical clustering, this cluster map can be referred to as an initial cluster map for the first iteration of block 307. Specifically, the cluster map of block 307 can be constructed by selectively assigning grid points in the T1-T2 domain of the fluid signatures of the $\tilde{W}$ matrix to the dominant or most-likely cluster.

Figure 4D:
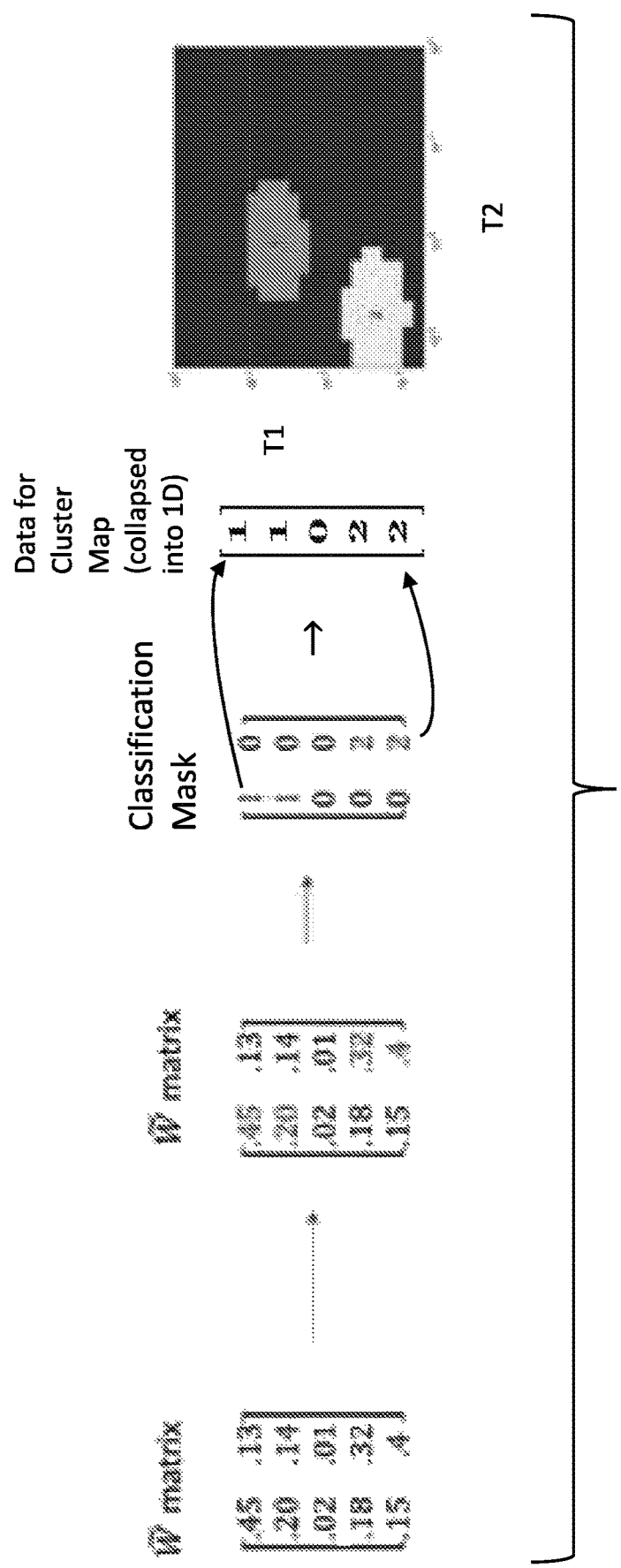

An example of these operations is shown in FIG. 4D for purposes of illustration. Note that as described above, each row in the $\tilde{W}$ matrix corresponds to a grid point in the reduced T1-T2 domain and each column in the $\tilde{W}$ matrix corresponds to one of two different fluid types (for the case here where $N_c=2$). Thus, column 1 in the $\tilde{W}$ matrix corresponds to a first fluid type and column 2 in the $\tilde{W}$ matrix corresponds to a second fluid type. The data element at a given row and column of the matrix $\tilde{W}$ represents the likelihood that the corresponding grid point in the reduced T1-T2 domain (indexed by the row of the matrix $\tilde{W}$) should be assigned to the corresponding fluid type (indexed by the column of the matrix $\tilde{W}$). For each row in the $\tilde{W}$ matrix, the most likely cluster and associated fluid type is given by the column number of the largest likelihood value in each row. This assignment assumes that there exists at most one fluid type (e.g., the dominant fluid type) that has a signature at a given grid point in the reduced T1-T2 domain. Furthermore, this assignment can be selectively carried out for each grid point in the $\tilde{W}$ matrix only when the likelihood values of corresponding columns in the $\tilde{W}$ matrix have sufficient magnitude. For example, in one embodiment, this thresholding criterion can be represented by:

$$\frac{\max_i \max_j f(T1_i, T2_j)}{f(T1, T2)} \geq \tau_2, \quad (3)$$

where $\max_i$ is maximum over all rows,
$\max_j$ is maximum over all columns,
$f(T1_i, T2_j)$ is the reduced T1-T2 map at grid point $(T1_i, T2_j)$, and
$\tau_2$ is a mask size, which can possibly have a value in the range of 6 to 10.

The information that represents the most likely cluster and associated fluid type for the grid points in the reduced T1-T2 domain can be represented by a classification mask as shown in FIG. 4D. Each row in the classification mask corresponds to a grid point in the reduced T1-T2 domain and each column in the classification mask corresponds to one of the two different fluid types (for the case here where $N_c=2$). For those grid points in the $\tilde{W}$ matrix where the likelihood values of corresponding columns in the $\tilde{W}$ matrix have sufficient magnitude, the data element for the grid point in one column of the classification mask includes an identifier for the most likely cluster and associated fluid type. Specifically, this one column corresponds to the column in the $\tilde{W}$ matrix that has a likelihood value greater than the likelihood values in the other column(s) in the $\tilde{W}$ matrix. The data element(s) for the grid point in the other column(s) of the classification mask store a null vale or zero. Thus, for the T1-T2 grid point corresponding to the first row of the $\tilde{W}$ matrix, the likelihood value of 0.45 for cluster 1 and the first fluid type of column 1 of the $\tilde{W}$ matrix is greater than the likelihood value of 0.13 for cluster 2 and the second fluid type of column 2 of the $\tilde{W}$ matrix. In this case, for the first row of the classification mask, the data element for the first column of cluster 1 and the first fluid type includes a "1" identifier while the data element for the second column of cluster 2 and the second fluid type includes a null or "0" value. This "1" identifier identifies cluster 1 and associated fluid type 1 as most likely associated with the corresponding T1-T2 grid point. Note that other binary values and identifiers can be used if desired. Furthermore, note that at this point in the process, the fluid types have yet to be associated with particular fluids (e.g., gas, water, oil, clay bound water, bitumen, etc.) as described below with respect to FIGS. 7A and 7B.

The classification mask can be processed to generate the data for the cluster map as shown in FIG. 4D. Each row or data element in the cluster map data corresponds to a grid point in the reduced T1-T2 domain and includes an identifier for the most likely cluster and associated fluid type for the corresponding T1-T2 grid point. In generating the cluster map, the common cluster/fluid type identifiers in the columns of the classification mask can be added to the data elements of the cluster map for the corresponding grid points as indicated by the curved arrows in FIG. 4D.

Figure 4E:
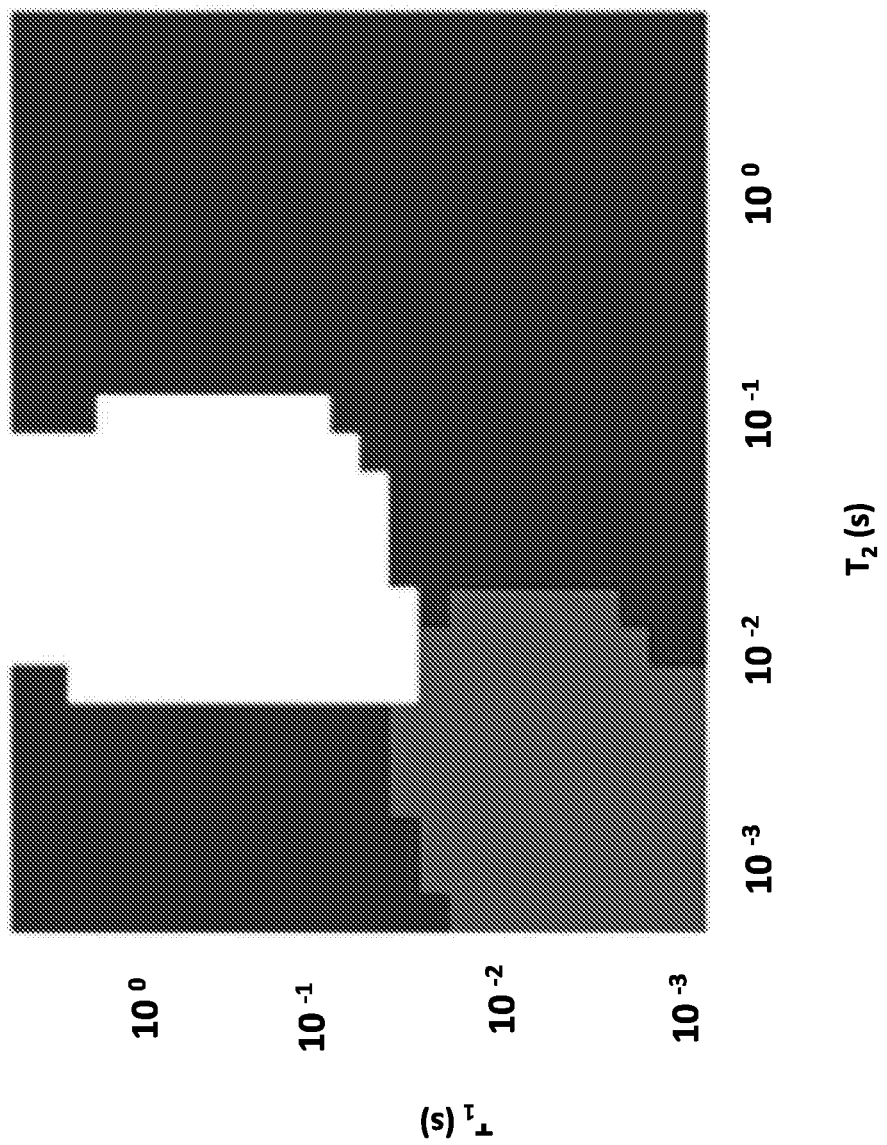

An exemplary cluster map is shown in FIG. 4E. This is a key step and differentiates the workflow of the present disclosure from previous methods in the literature. Previous methods attempt to find the source signatures and volumes simultaneously. On the other hand, the method of the present disclosure attempts to find only the support of each fluid in the W matrix, under the assumption that fluids cannot have overlapping T1-T2 signatures. As will be shown later, since the underlying assumptions used in the development of the algorithms are very different, the volumes computed from the methods are also significantly different.

In block 309, an automatic hierarchical clustering is carried out under the assumption that it is unlikely for a fluid to have a T1-T2 signature that has disconnected pieces. The automatic hierarchical clustering employs the NNMF operations of blocks 307 and 309 for different values of $N_c$ as adjusted in block 311 (i.e., over varying fluid number), until the resulting cluster map satisfies a constraint of connectedness that the clustering does not result in breaking any cluster of the cluster map into multiple disconnected pieces. A cluster satisfies its part in the constraint of connectedness if all of the grid points of that cluster are "connected to" one another in the reduced T1-T2 space. In embodiments, a grid point A can be identified as being "connected to" another grid point B if grid point A is adjacent to grid point B in the reduced T1-T2 space. Thus, for any grid point in the T1-T2 space, there are four possible connected grid points that surround the grid point. When the constraint of connectedness is not satisfied, the value of $N_c$ is decremented in block 311 to reduce the number of fluid types in the cluster map and the processing reverts to perform the NNMF operations of block 307 and evaluate the resulting clustering in block 309. When the constraint of connectedness is satisfied, the operations continue to block 313.

In block 313, the value of $N_c$ that satisfied the constraint of connectedness and the cluster map corresponding to $N_c$ different fluids that satisfied the constraint of connectedness is generated and saved.

Figure 5:
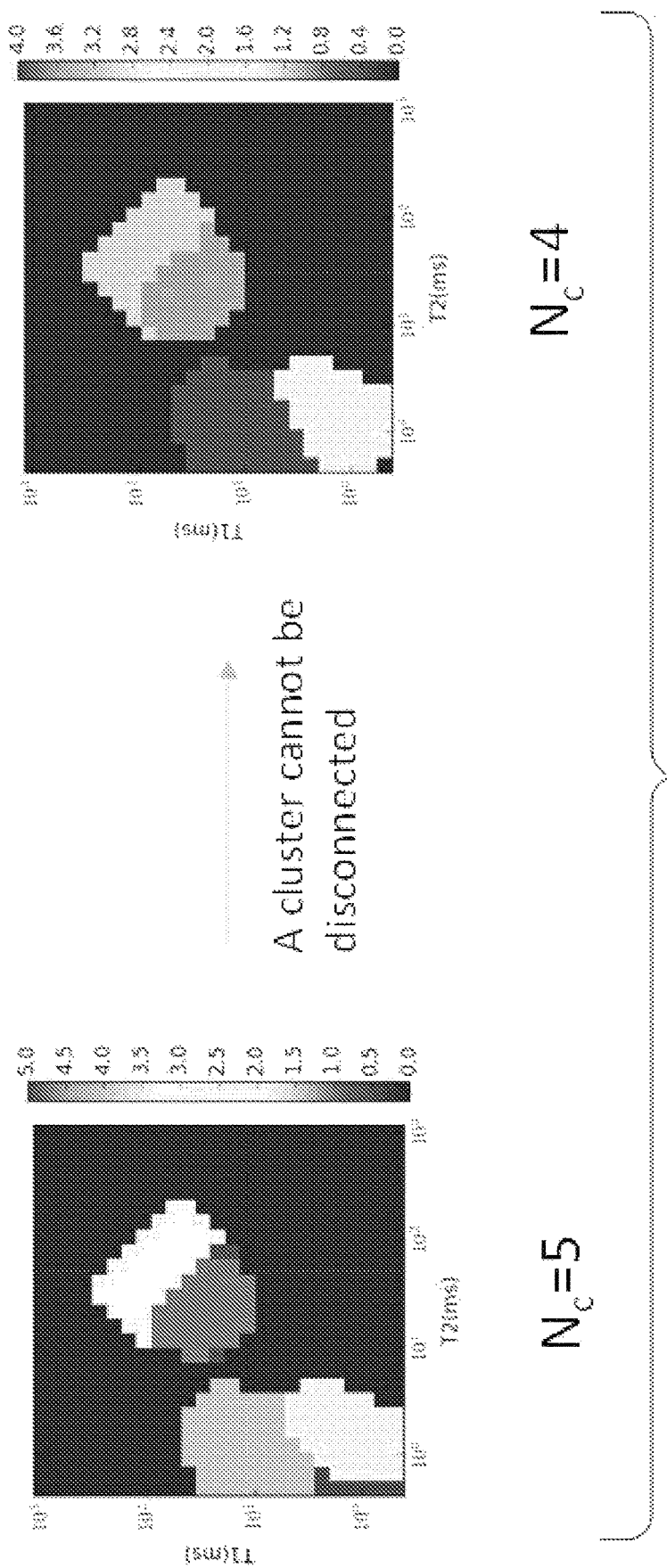
FIG. 5 is a graphical representation of clustering operations over varying number of fluid components (where $N_C$ is 5 and 4), which results in different images for the matrix $\tilde{W}$ and subsequently different cluster maps; using the observation that it is unlikely for a fluid to have signatures that are disconnected in T1-T2 domain, the value of $N_C$ can be reduced until the method results in clusters that are connected within themselves.

An example of the automatic hierarchical clustering is illustrated in FIG. 5, where the cluster map derived from an a NNMF with $N_c$=5 does not satisfy the constraint for connectedness. Therefore, the algorithm has to reduce to $N_c$=4, to satisfy the constraint of connectedness.

In block 315, the operations check whether the counter Ntrials has reached the threshold maximum counter value MaxNtrials as input to the process. If the check of 315 fails, the counter Ntrials is incremented in block 317 and the operations of blocks 305 to 315 are repeated using sub-sampling of the T1-T2 maps that are input to the process. Note that the multiple iterations of blocks 305 to 315 using subsampling of the data can help evaluate the robustness of the results of the automatic hierarchical clustering. In this manner, the value of MaxNtrials can be used to control the subsampling operations. Note that if there are N T1-T2 maps input to the process as shown, the sub-sampling requires analyzing a subset ($\Leftarrow$N) at any given iteration. If the check of 315 passes, the operations continue to block 319.

In block 319, a histogram is generated for the $N_c$ values saved in block 311 over the MaxNtrials iterations of the sub-sampling process. At the end of this step, there are several cluster maps for each $N_c$. An average cluster map is computed for each $N_c$, keeping in mind that the clusters are permutation invariant. For example, assume that there are three clusters. In one cluster map, they are labelled as '1', '2' and '3'. In a second cluster map, they are labelled as '2', '1', and '3'. Due to permutation invariance, we know that label '1' of the first cluster map is the same as label '2' of the second cluster map and label '2' of the first cluster map is the same as label '1' of the second cluster map. The histogram of $N_c$ provides a qualitative look and evaluates confidence in the results.

Figure 6A:
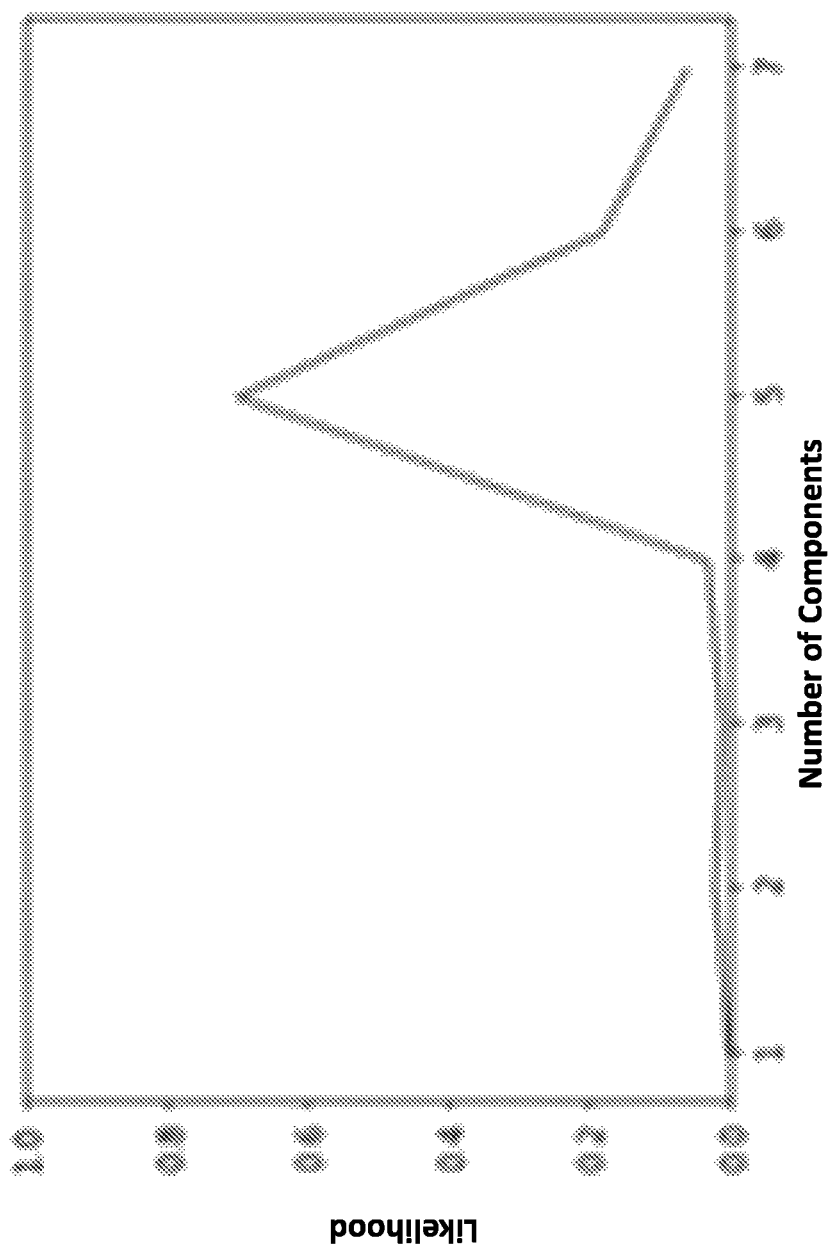
FIG. 6A shows a histogram of $N_C$ obtained by running the analysis multiple times on sub-sampled data. The maximum value corresponding to the peak and the width of the histogram can help provide a confidence measure for $N_C$. The histogram of possible $N_C$ shows that 5 clusters is a likely solution.
Figure 6B:
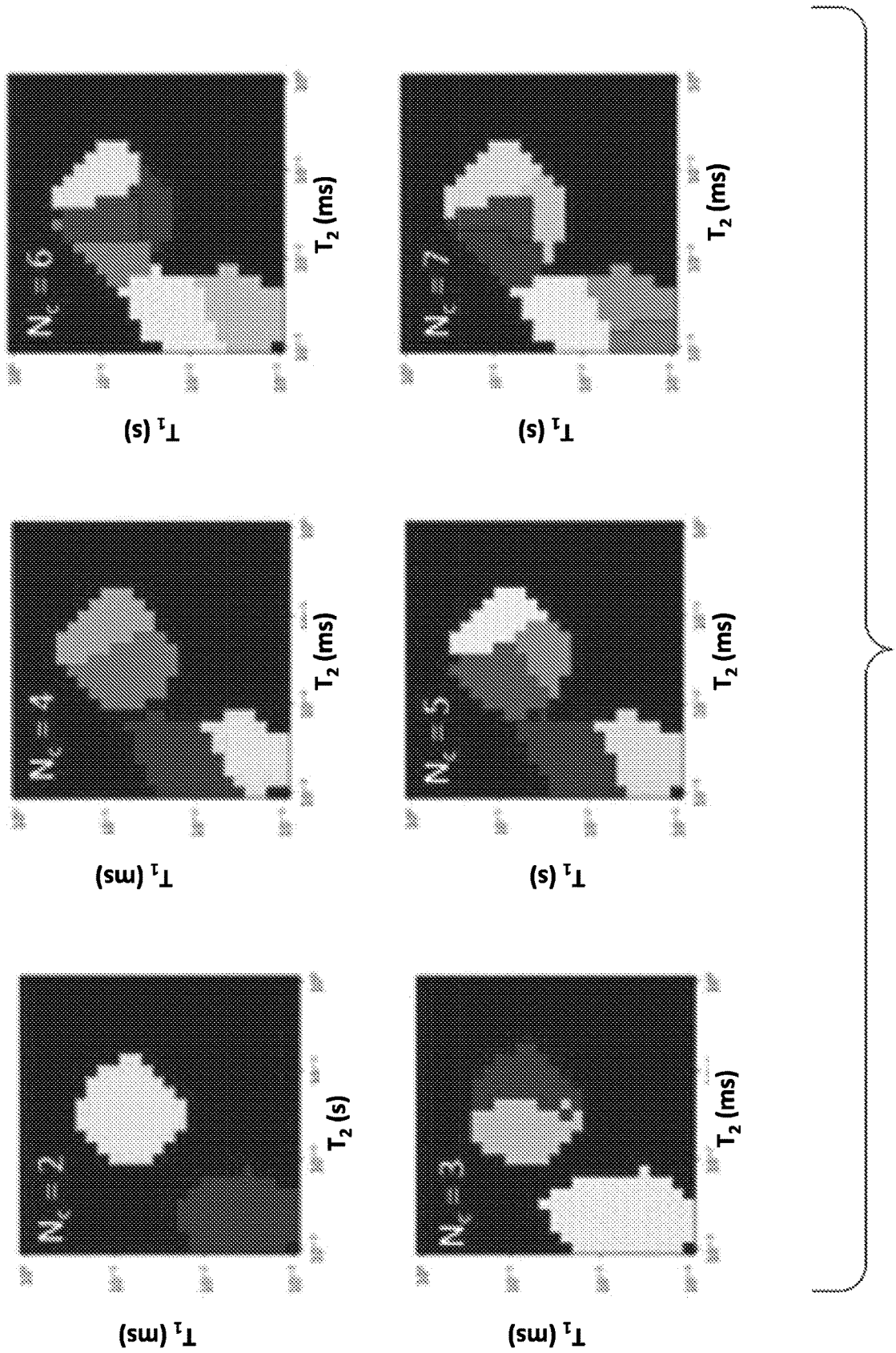
FIG. 6B is a graphical representation of the automated clustering solutions for different values of $N_C$ of the histogram of FIG. 6A.

FIG. 6A shows a histogram obtained by running the analysis multiple times on sub-sampled data. The maximum value corresponding to the peak and the width of the histogram help provide a confidence measure for $N_c$. The automated clustering solutions for the different values of $N_c$ are shown in FIG. 6B.

Figure 7A:
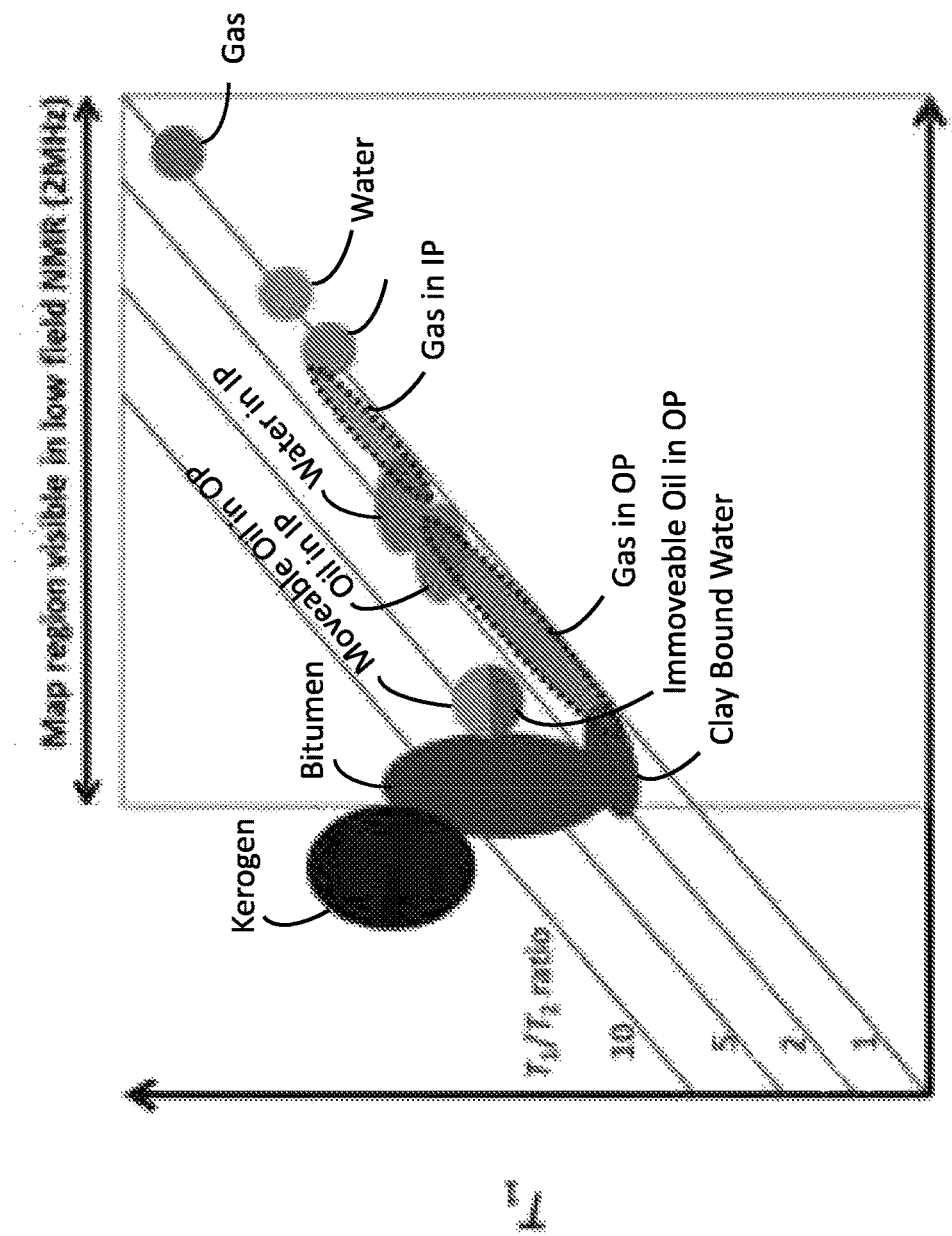
FIG. 7A is a plot of the T1-T2 domain depicting regions in the T1-T2 domain as well as T1/T2 ratios that are known to indicate the presence of certain formation fluid types as shown.

Finally, a cluster map that results from automatic hierarchical clustering and/or sub-sampling as described above can be selected as a final cluster map and specific fluid types can be assigned to the cluster/fluid type identifiers of the final cluster map. In an embodiment, such assignment can be carried out by a user (domain expert) where the user specifies or links or otherwise associates a particular fluid type (e.g., gas, water, oil, clay bound water, bitumen, etc.) to each one of the cluster/fluid type identifiers of the final cluster map. This assignment can follow domain knowledge of the regions in the T1-T2 space and estimated T1/T2 ratios that are typically indicative of the presence of the different fluid types as shown in FIGS. 7A and 7B, which is taken from Kausik et al., "NMR Relaxometry in Shale and implications for Logging," Petrophysics, Vol. 57, No. 4, August 2016, pgs. 339-350. In other embodiments, rule-based algorithms or machine learning algorithms or other automatic processing can be configured to perform such assignment.

In embodiments, the final cluster map (and resulting boundaries in the T1-T2 domain) can be used to quantify the volumes of the $N_c$ different fluids specified by the final cluster map at one or more depths in the formation. For a depth in the formation, the T1-T2 map at that depth includes portions that correspond to the different fluids that are present at the depth. Specifically, each one of these portions is a portion of the T1-T2 map (in the grid point or pixel space in the T1-T2 domain) that is covered by a cluster that corresponds to a given fluid. Thus, the sum of the grid points (or pixels) of the T1-T2 map that are covered by a cluster corresponds to the volume of the fluid that corresponds to that cluster at the depth of the T1-T2 map. For example, the sum of the grid points of the T1-T2 map that are covered by a cluster corresponding to clay bound water corresponds to the volume of clay bound water at the depth of the T1-T2 map. Such analysis can be repeated on the final cluster map and corresponding T1-T2 maps for multiple depths in the formation to quantify the volumes of the different fluids at the multiple depths.

Furthermore, the final cluster map (and resulting boundaries in the T1-T2 domain) can be used to extract the T1-T2, T1 and/or T2 distributions for the different fluids. Specifically, the T1-T2 distribution for a given fluid at a depth in the formation can be derived from the grid points of the T1-T2 map at that depth that are covered by the cluster that corresponds to the given fluid. The T1 distribution for a given fluid at a depth in the formation can be derived from the T1 values of the grid points of the T1-T2 map at that depth that are covered by the cluster that corresponds to the given fluid. The T2 distribution for a given fluid at a depth in the formation can be derived from the T2 values of the grid points of the T1-T2 map at that depth that are covered by the cluster that corresponds to the given fluid. Such analysis can be repeated on the final cluster map and corresponding T1-T2 maps for multiple depths in the formation to extract the T1-T2, T1 and/or T2 distributions for the different fluids at the multiple depths. The resulting T1-T2, T1 and/or T2 distributions of the different fluids as a function of depth can be used for additional analysis and interpretation, for example to estimate oil viscosity, rock quality, permeability, and other petrophysical properties and their variation with depth. For example, Freedman et al., "Wettability, Saturation and Viscosity from NMR Measurements," describes techniques to determine wettability, saturation and oil viscosity from T2 distributions. In this example, wettability is determined by comparing the oil and brine T2 distributions measured in the partially saturated rocks with the bulk oil T2 distribution and with the T2 distribution of the fully brine-saturated sample. The brine and oil T2 distributions are also used to compute saturation and oil viscosity values.

There are a few key advantages of this method over other methods proposed in the literature. First, it does not require pre-determined information about cut-offs to distinguish fluids. These cut-offs are automatically estimated from the data. Second, simulations show that the method does not require a wide variation in fluid volumes at different depths. This allows the petro-physicist to pick a relatively short depth interval corresponding to the same rock or fluid type and study variation in measurements due to variations in fluid or rock properties. Lastly, it provides a framework to automatically compute the number of fluids in the underlying data set, together with volumes of corresponding fluids and their T1-T2, T1 and T2 distributions per depth. This method has been benchmarked on multiple simulations. We present the results of a representative simulation.

Simulation

Figure 8A:
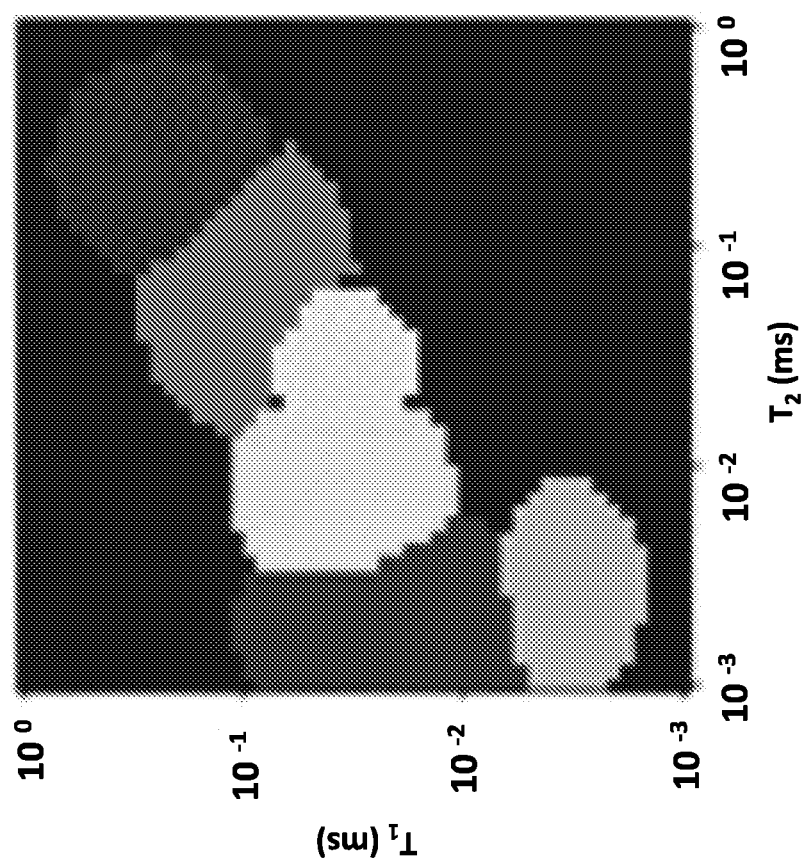
FIGS. 8A, 8B, 8C, 8D and 8E show simulation results corresponding to six fluids.
Figure 8B:
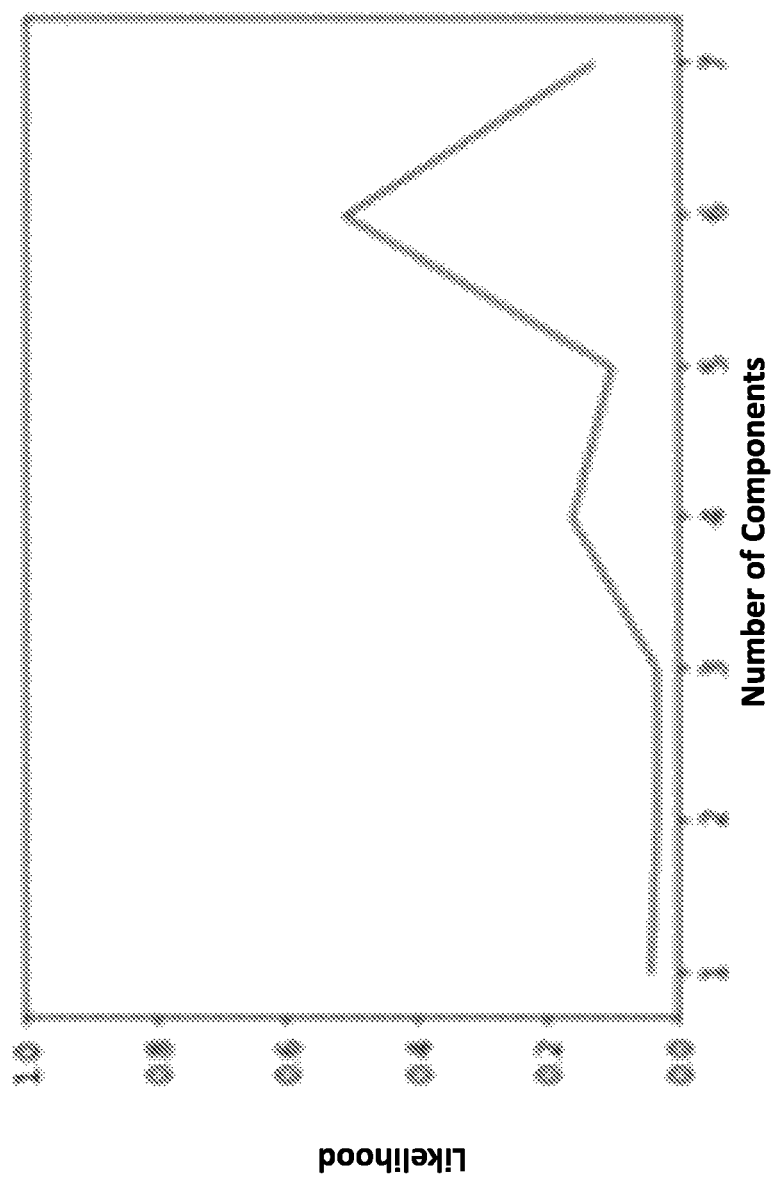
Figure 8C:
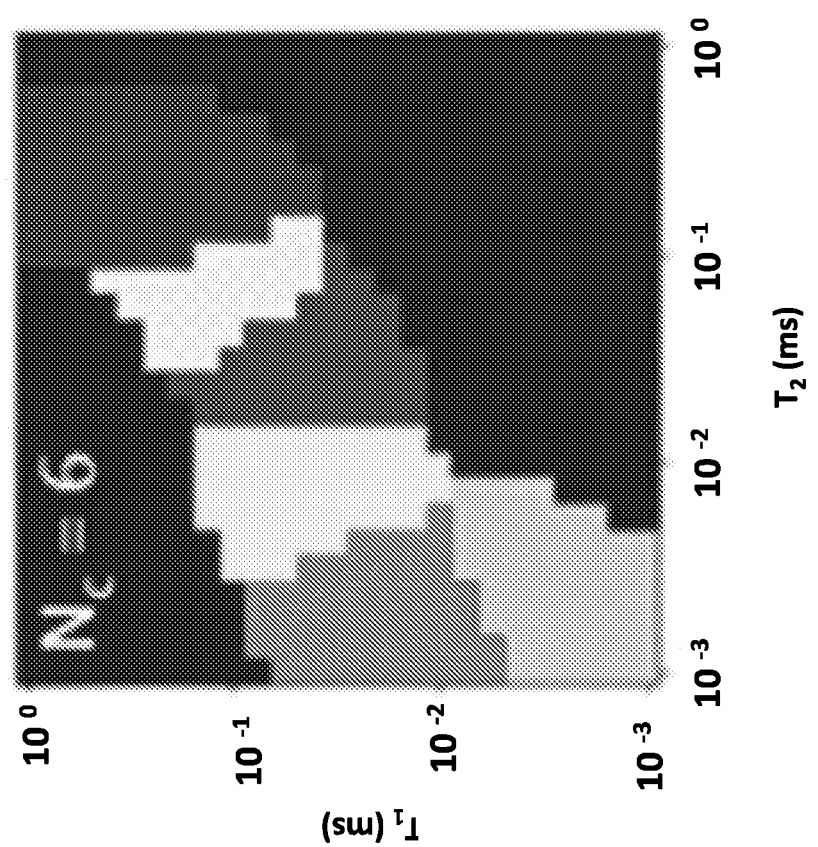
Figure 8D:
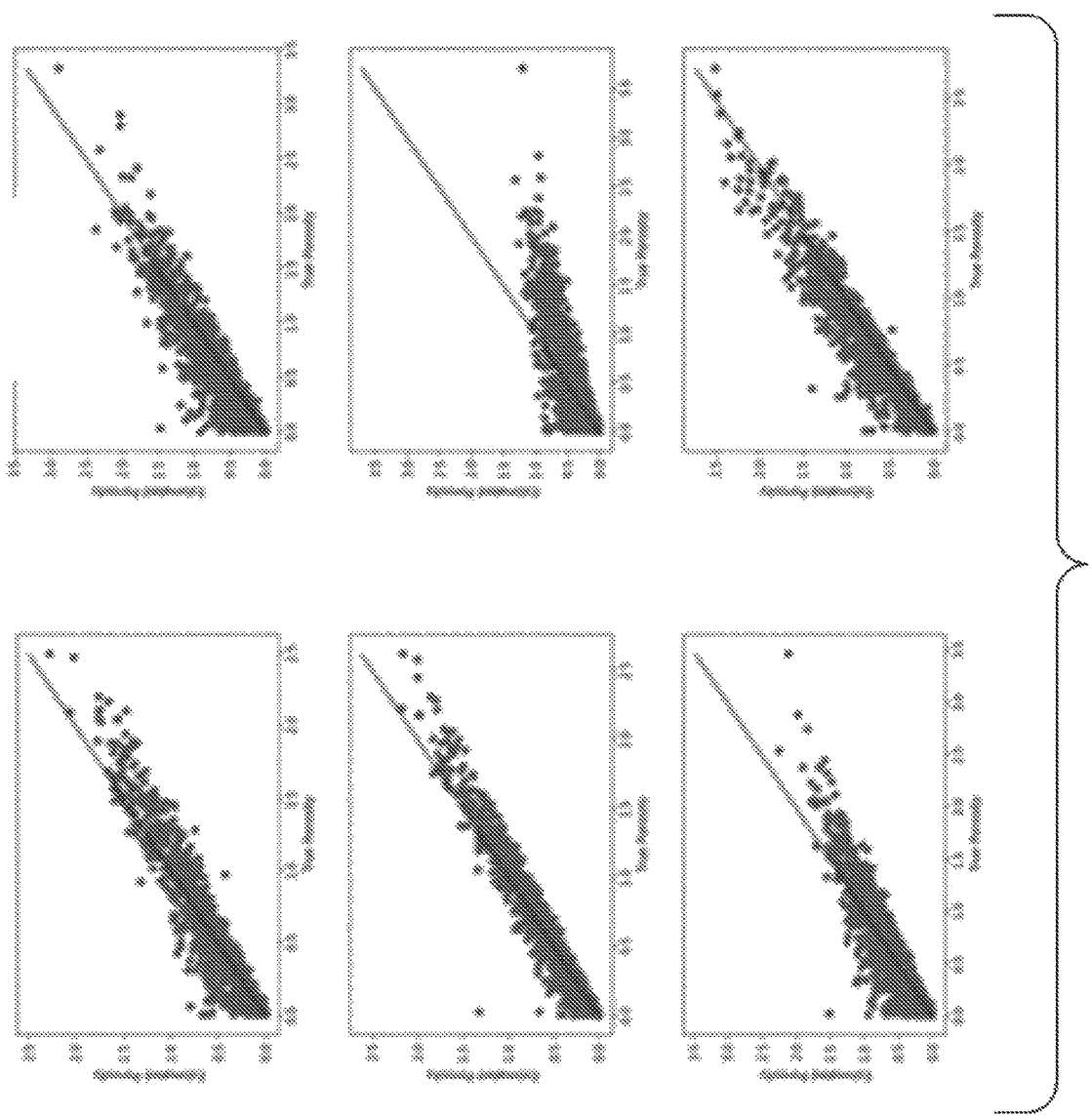
Figure 8E:
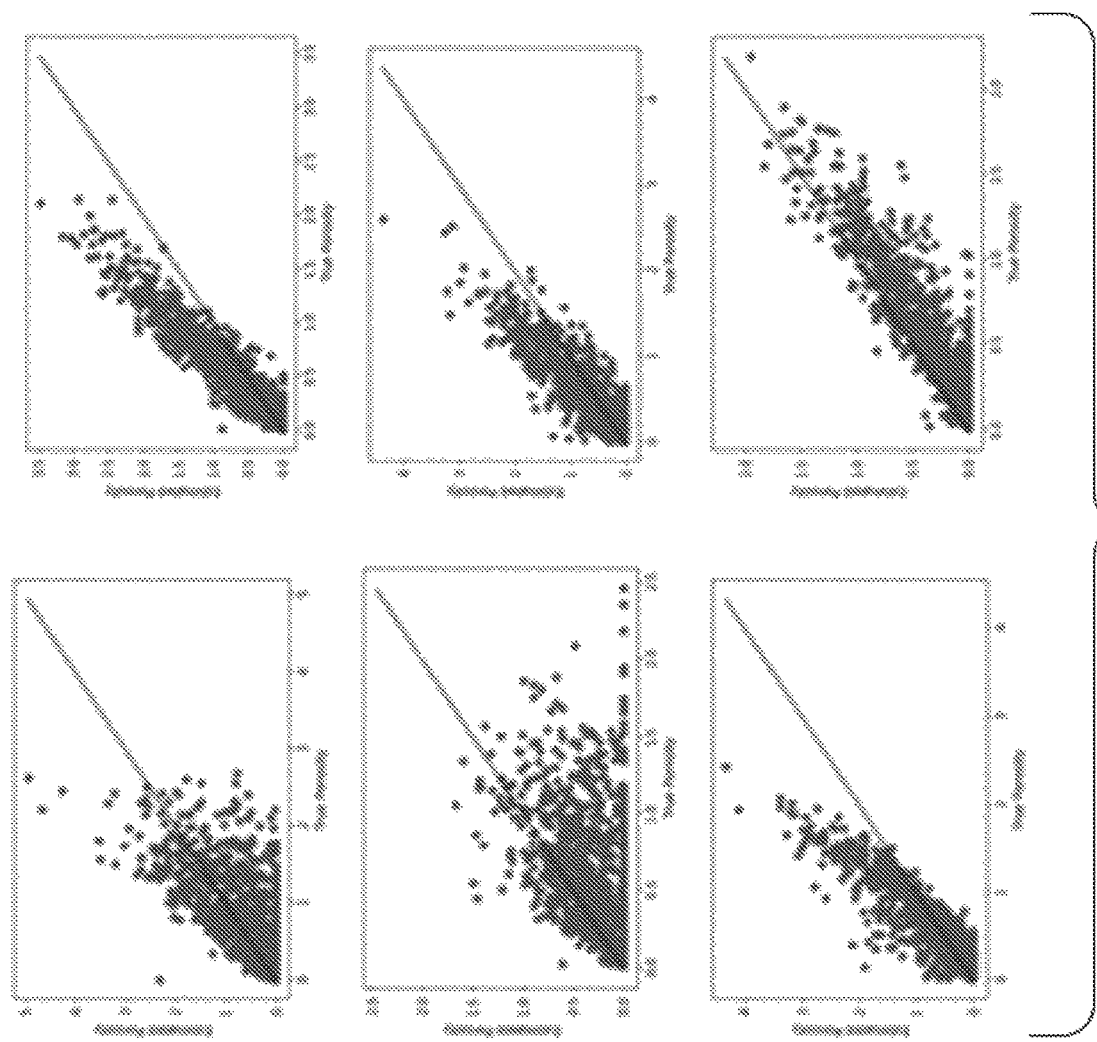

The true T1-T2 map from which six fluids were generated is shown in FIG. 8A. Different linear combinations were obtained to simulate 100 different maps. Magnetization data obtained from these maps was corrupted with white, Gaussian noise with a SNR of 15. These data were inverted using an inverse Laplace transform procedure described in L. Venkataramanan, Y. Q. Song and M. D. Hurlimann, "Solving Fredholm integrals of the first kind with tensor product structure in 2 and 2.5 dimensions", IEEE Trans on Signal Processing, Vol 50, No. 5, 2002. These data sets were then analyzed using the unsupervised hierarchical clustering method described in the present disclosure and the histogram of $N_c$ is shown in FIG. 8B and resulting clusters is shown in FIG. 8C. It can be seen that the resulting cluster with $N_c=6$ is very similar to the true map used to simulate the data. The resulting volumes of the six components are compared with the true volumes used to simulate the data and compared with that of blind source separation method in FIGS. 8D and 8E. Comparing the results in the volume estimation, we observe that this method out-performs the results of BSS in this simulation.

Figure 9:
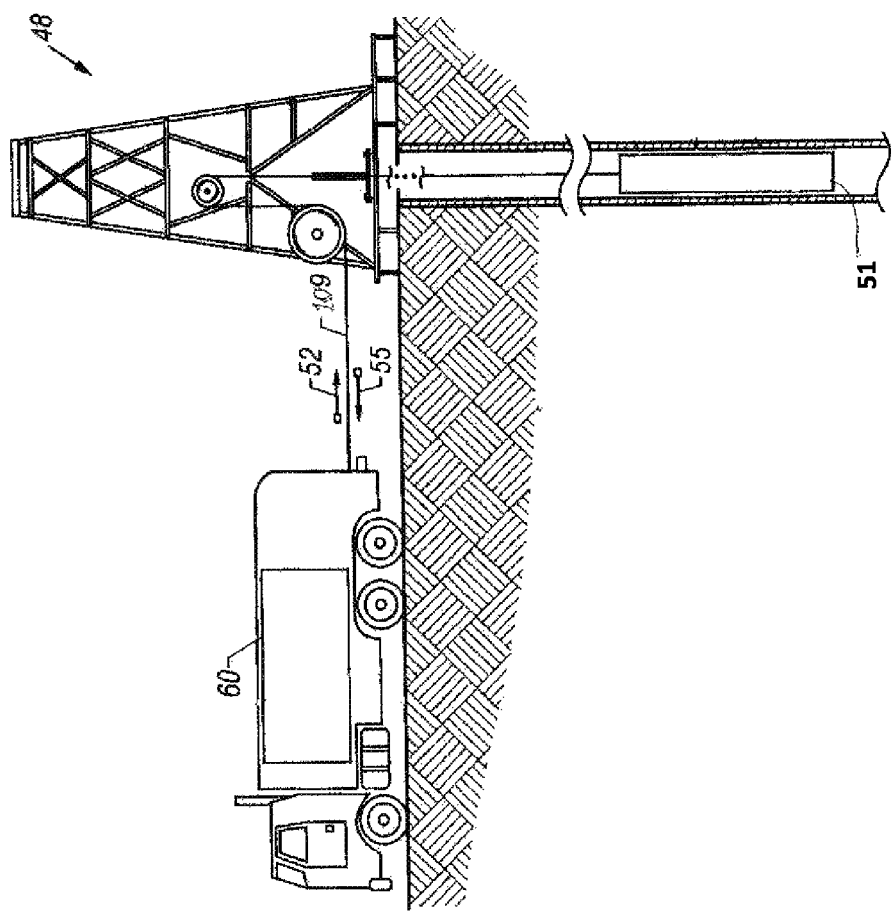
FIG. 9 illustrates an example wellsite which can embody parts of the methodology of the present disclosure.

FIG. 9 illustrates a wellsite 48 which can embody the methods of the present disclosure as described herein. Wellsite 48 is shown as being onshore, however it can be offshore as well. In this example system, a borehole is formed such that it traverses a subsurface formation by rotary drilling in a manner that is well known. A wireline tool string 51 is conveyed in the borehole by a wireline cable 109. The wireline tool string 51 includes a nuclear magnetic resonance (NMR) tool and possibly other downhole tools (such as a resistivity tool, a nuclear tool, a downhole fluid analysis tool, a downhole sampling tool, etc.). The operations of the tool(s) of the wireline tool string 51 can be controlled by data 52 (e.g., commands and associated data) generated by a surface-located control unit 60 and communicated via the wireline cable 109 to the tool below. For example, data that specifies one or more NMR measurement sequences carried out by the NMR tool at different depths of the borehole may be generated by the control unit 60 and communicated via the wireline cable 109 to the NMR tool. Data 55 measured by the operations of the tools(s) of the wireline tool string 51, including NMR data measured by the NMR measurements sequences carried out by the NMR tool at different depths of the borehole, can be communicated via the wireline cable 109 to the control unit 60 for storage and processing. In other embodiments, data that specifies the one or more NMR measurement sequences carried out by the NMR tool at different depths of the borehole may be loaded into the NMR tool via other techniques (via a serial link before the tool is lowered downhole, for example).

Figure 10:
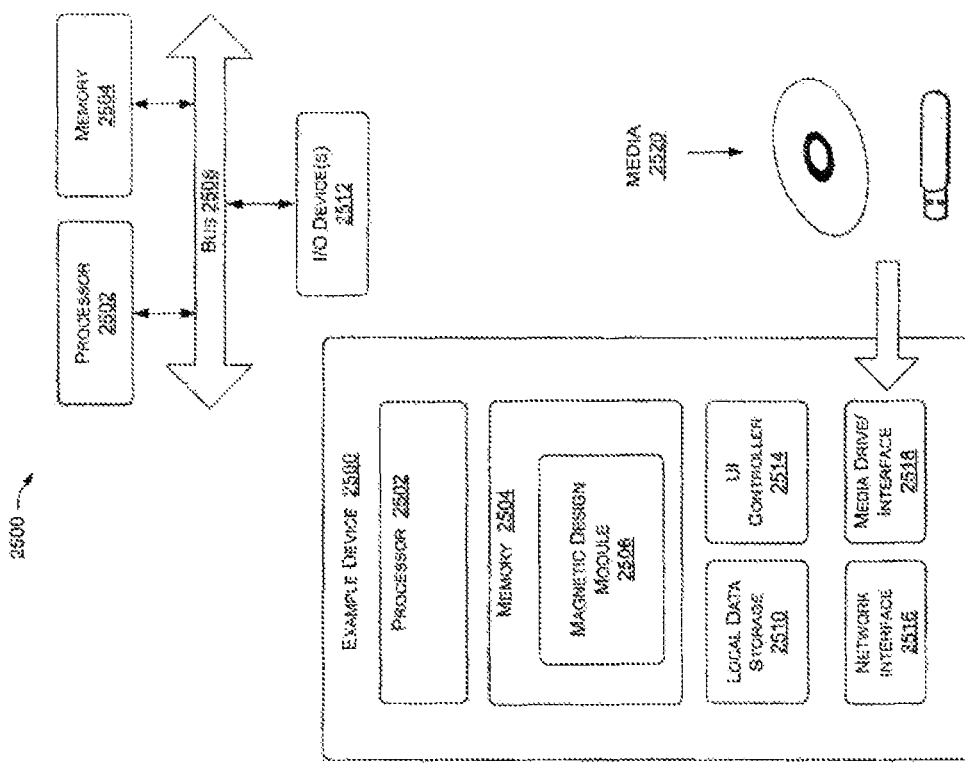
FIG. 10 illustrates an example computing device that can be used to embody parts of the methodology of the present disclosure.

In embodiments, the control unit 60 and/or the tool(s) of the wireline tool string 51 can be implemented by a programmed device 2500, or a plurality thereof, as shown in FIG. 10. In other implementations, one or more device 2500 can be located remoted from the wellsite 48 and operably coupled to the control unit 60 via networked data communication.

In still other embodiments, the NMR tool (and possibly other downhole tools of the tool string) can be realized as part of a bottom hole assembly (BHA) of a drill string for logging-while-drilling applications. In these embodiments, the NMR measurements (and possibly the downhole measurements performed by the other downhole tools of the BHA) can be carried out while drilling the borehole that traverses the formation.

In embodiments, the NMR measurements sequences carried out by the NMR tool can be configured to acquire NMR data that characterizes the formation at a given depth of the borehole by establishing an equilibrium condition where the spins of nuclei within the formation align themselves along an applied static magnetic field. This equilibrium condition can be disturbed by a pulse of an oscillating magnetic field (e.g. a radio frequency (RF) pulse), which tips the spins away from the static field direction. After tipping, two things occur simultaneously. First, the spins precess around the static field at the Larmor frequency, given by $\omega_0 = \gamma \times B_0$, where $B_0$ is the strength of the static field and $\gamma$ is the gyromagnetic ratio. Second, the spins return to the equilibrium direction according to a decay time $T_1$, which is called the longitudinal relaxation time constant or spin lattice relaxation time constant. For hydrogen nuclei, $\gamma/2\pi = 4258$ Hz/Gauss, so, for example, for a static field of 235 Gauss, the frequency of precession would be 1 MHz. Also associated with the spin of molecular nuclei is a second relaxation time constant, $T_2$, called the transverse relaxation time constant or spin-spin relaxation time constant. At the end of a ninety-degree tipping pulse, all the spins are pointed in a common direction perpendicular to the static field, and they all precess at the Larmor frequency. The net precessing magnetization decays with a time constant T2 because the individual spins rotate at different rates and lose their common phase. At the molecular level, dephasing is caused by random motions of the spins. A distribution of multiple T1s (or a T1 distribution) together with a distribution of multiple T2s (or T2 distribution) can be measured using this technique to derive a T1-T2 map as the NMR data that characterizes the formation at a given depth of the borehole.

In embodiments, the NMR measurements sequences carried out by the NMR tool can be configured to acquire NMR data that characterizes the formation at a given depth of the borehole using an RF pulse sequence known as the CPMG (Carr-Purcell-Meiboom-Gill) sequence. As is well known, after a wait time that precedes each pulse sequence, a ninety-degree pulse causes the spins to start precessing. Then a one-hundred-eighty-degree pulse is applied to cause the spins which are dephasing in the transverse plane to refocus. By repeatedly refocusing the spins using one-hundred-eighty-degree pulses, a series of "spin echoes" appear, and the train of echoes can be measured. The trains of echoes can be processed (typically using Fast inversion Laplace-Laplace processing) to determine a distribution of multiple T1s as well as a distribution of multiple T2s to derive a T1-T2 map that characterizes the formation at a given depth of the borehole.

FIG. 10 illustrates an example device 2500, with a processor 2502 and memory 2504 that can be configured to implement various embodiments of methods as discussed in this disclosure. Memory 2504 can also host one or more databases and can include one or more forms of volatile data storage media such as random-access memory (RAM), and/or one or more forms of nonvolatile storage media (such as read-only memory (ROM), flash memory, and so forth).

Device 2500 is one example of a computing device or programmable device and is not intended to suggest any limitation as to scope of use or functionality of device 2500 and/or its possible architectures. For example, device 2500 can comprise one or more computing devices, programmable logic controllers (PLCs), etc.

Further, device 2500 should not be interpreted as having any dependency relating to one or a combination of components illustrated in device 2500. For example, device 2500 may include one or more of a computer, such as a laptop computer, a desktop computer, a mainframe computer, etc., or any combination or accumulation thereof.

Device 2500 can also include a bus 2508 configured to allow various components and devices, such as processors 2502, memory 2504, and local data storage 2510, among other components, to communicate with each other.

Bus 2508 can include one or more of any of several types of bus structures, including a memory bus or memory controller, a peripheral bus, an accelerated graphics port, and a processor or local bus using any of a variety of bus architectures. Bus 2508 can also include wired and/or wireless buses.

Local data storage 2510 can include fixed media (e.g., RAM, ROM, a fixed hard drive, etc.) as well as removable media (e.g., a flash memory drive, a removable hard drive, optical disks, magnetic disks, and so forth).

One or more input/output (I/O) device(s) 2512 may also communicate via a user interface (UI) controller 2514, which may connect with I/O device(s) 2512 either directly or through bus 2508.

In one possible implementation, a network interface 2516 may communicate outside of device 2500 via a connected network.

In one possible embodiment, equipment 2430 may communicate with device 2500 as input/output device(s) 2512 via bus 2508, such as via a USB port, for example.

A media drive/interface 2518 can accept removable tangible media 2520, such as flash drives, optical disks, removable hard drives, software products, etc. In one possible implementation, logic, computing instructions, and/or software programs comprising elements of magnet design module 2506 may reside on removable media 2520 readable by media drive/interface 2518.

In one possible embodiment, input/output device(s) 2512 can allow a user to enter commands and information to device 2500, and also allow information to be presented to the user and/or other components or devices. Examples of input device(s) 2512 include, for example, sensors, a keyboard, a cursor control device (e.g., a mouse), a microphone, a scanner, and any other input devices known in the art. Examples of output devices include a display device (e.g., a monitor or projector), speakers, a printer, a network card, and so on.

Various processes of present disclosure may be described herein in the general context of software or program modules, or the techniques and modules may be implemented in pure computing hardware. Software generally includes routines, programs, objects, components, data structures, and so forth that perform particular tasks or implement particular abstract data types. An implementation of these modules and techniques may be stored on or transmitted across some form of tangible computer-readable media. Computer-readable media can be any available data storage medium or media that is tangible and can be accessed by a computing device. Computer readable media may thus comprise computer storage media. "Computer storage media" designates tangible media, and includes volatile and non-volatile, removable and non-removable tangible media implemented for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other tangible medium which can be used to store the desired information, and which can be accessed by a computer.

Although a few example embodiments have been described in detail above, those skilled in the art will readily appreciate that many modifications are possible in the example embodiments without materially departing from this disclosure. Accordingly, such modifications are intended to be included within the scope of this disclosure. Moreover, embodiments may be performed in the absence of any component not explicitly described herein.

What is claimed is:

1. A method of characterizing fluids in a subterranean formation traversed by a borehole, comprising:
   a) measuring NMR data by a downhole NMR tool that is conveyed in the borehole that traverses the formation;
   b) processing the NMR data of a) to derive T1-T2 maps at different depths of the formation using a processor executing instructions stored in a non-transitory, machine-readable medium;
   c) processing, using the processor, the T1-T2 maps at different depths of the formation of b) to generate a cluster map of different fluids that are present in the formation, wherein the cluster map is a two-dimensional array of grid points in the T1-T2 domain with each grid point being assigned or classified to a specific fluid; and
   d) using the processor, using the cluster map of different fluids that are present in the formation of c) to characterize properties of the formation.

2. A method according to claim 1, wherein:
   the operations of d) involve applying the cluster map of different fluids that are present in the formation of c) to a T1-T2 map corresponding to a particular depth of the formation to calculate fluid volumes for the different fluids that are present in the formation at the particular depth.

3. A method according to claim 1, wherein:
   the operations of d) involve applying the cluster map of different fluids that are present in the formation of c) to T1-T2 maps corresponding to a number of depths of the formation to calculate fluid volumes for the different fluids that are present in the formation at the number of depths.

4. A method according to claim 1, wherein the operations of d) involve:
   applying the cluster map of different fluids that are present in the formation of c) to at least one of T1-T2 distributions, T1 distributions, and T2 distributions corresponding to a depth in the formation to extract the respective T1-T2 distributions, T1 distributions or T2 distributions for the different fluids at the corresponding depth; and using the extracted T1-T2 distributions, T1 distributions or T2 distributions of the different fluids at the corresponding depth for additional analysis and interpretation of the formation.

5. A method according to claim 1 wherein the operations of d) involve:

applying the cluster map of different fluids that are present in the formation of c) to at least one of T1-T2 distributions, T1 distributions, and T2 distributions corresponding to a number of depths in the formation to extract the respective T1-T2 distributions, T1 distributions or T2 distributions for the different fluids at the number of depths; and using the extracted T1-T2 distributions, T1 distributions or T2 distributions of the different fluids as a function of depth for additional analysis and interpretation of the formation.

6. A method according to claim 1, wherein:

the NMR data of a) and corresponding T1-T2 maps of b) characterize a particular interval of interest within the formation; and the cluster map of different fluids that are present in the formation of c) is used to characterize properties of the interval of interest in the formation.

7. A method according to claim 1, wherein the cluster map of different fluids that are present in the formation of c) is determined by:

constructing a matrix of T1-T2 maps from the T1-T2 maps of b);

performing a non-negative matrix factorization (NNMF) procedure on the matrix of T1-T2 maps to determine an initial cluster map for an initial guess of Nc different fluids; and performing a hierarchical clustering process that involves non-negative matrix factorization (NNMF) procedure on the matrix of T1-T2 maps for different values of Nc to determine a cluster map for a solved Nc of different fluids dictated by a constraint of connectedness with regard to all clusters in the cluster map; and assigning specific fluid types to the clusters of the cluster map that is determined by the hierarchical clustering process.

8. A method according to claim 7, wherein:

the cluster map includes data elements that correspond to grid points in the matrix of T1-T2 maps, wherein the data elements for each cluster of the cluster map are assigned to a unique cluster identifier based on likelihood values of the associated grid points as determined from the non-negative matrix factorization (NNMF) procedure; and the constraint of connectedness does not break any cluster as identified by a particular cluster identifier into multiple disconnected pieces.

9. A method according to claim 7, wherein:

the matrix of T1-T2 maps is constructed in a reduced T1-T2 domain determined from analysis of an average T1-T2 map based on a number of T1-T2 maps of b) at different depths.

10. A method according to claim 7, wherein the cluster map of different fluids that are present in the formation of c) is further determined by:

evaluating results of the hierarchical clustering process by sub-sampling NMR data multiple times.

11. A method according to claim 10, wherein:

a subset of T1-T2 maps is taken for analysis at any given iteration.

12. A method according to claim 1, wherein:

the downhole NMR tool comprises a wireline tool.

13. A method according to claim 1, wherein:

the downhole NMR tool comprises a measuring-while-drilling tool.

14. A system for characterizing fluids in a subterranean formation traversed by a borehole, comprising:

a downhole NMR tool that is conveyed in the borehole that traverses the formation and measures NMR data;

a non-transitory, machine-readable medium storing code to perform one or more operations; and at least one processor that is configured to perform the one or more operations, wherein the one or more operations comprise:

i) processing the NMR data to derive T1-T2 maps at different depths of the formation;

ii) processing the T1-T2 maps at different depths of the formation of i) to generate a cluster map of different fluids that are present in the formation, wherein the cluster map is a two-dimensional array of grid points in the T1-T2 domain with each grid point being assigned or classified to a specific fluid; and iii) using the cluster map of different fluids that are present in the formation of ii) to characterize properties of the formation.

15. A system according to claim 14, wherein:

the operations of iii) involve applying the cluster map of different fluids that are present in the formation of ii) to a T1-T2 map corresponding to a particular depth of the formation to calculate fluid volumes for the different fluids that are present in the formation at the particular depth.

16. A system according to claim 14, wherein:

the operations of iii) involve applying the cluster map of different fluids that are present in the formation of ii) to T1-T2 maps corresponding to a number of depths of the formation to calculate fluid volumes for the different fluids that are present in the formation at the number of depths.

17. A system according to claim 14, wherein the operations of iii) involve:

applying the cluster map of different fluids that are present in the formation of ii) to at least one of T1-T2 distributions, T1 distributions, and T2 distributions corresponding to a depth in the formation to extract the respective T1-T2 distributions, T1 distributions or T2 distributions for the different fluids at the corresponding depth; and using the extracted T1-T2 distributions, T1 distributions or T2 distributions of the different fluids at the corresponding depth for additional analysis and interpretation of the formation.

18. A system according to claim 14, wherein the operations of iii) involve:

applying the cluster map of different fluids that are present in the formation of ii) to at least one of T1-T2 distributions, T1 distributions, and T2 distributions corresponding to a number of depths in the formation to extract the respective T1-T2 distributions, T1 distributions or T2 distributions for the different fluids at the number of depths; and using the extracted T1-T2 distributions, T1 distributions or T2 distributions of the different fluids as a function of depth for additional analysis and interpretation of the formation.

19. A system according to claim 15, wherein:
the at least one processor or portion thereof is part of the downhole NMR tool.

20. The method of claim 1, wherein processing the T1-T2 maps comprises generating the T1-T2 maps using unsupervised machine learning.

* * * * *